United States Patent [19]
Johnson et al.

[11] Patent Number: 6,121,539
[45] Date of Patent: Sep. 19, 2000

[54] THERMOELECTRIC DEVICES AND METHODS FOR MAKING THE SAME

[75] Inventors: Gregory M. Johnson; Jon A. Casey, both of Poughkeepsie; Scott R. Dwyer, Troy; David C. Long, Wappingers Falls; Kevin M. Prettyman, Holmes, all of N.Y.

[73] Assignee: International Business Machines Corporation, Armonk, N.Y.

[21] Appl. No.: 09/141,481

[22] Filed: Aug. 27, 1998

[51] Int. Cl.⁷ .................................................. H01L 35/28
[52] U.S. Cl. ..................... 136/203; 136/236.1; 136/241
[58] Field of Search ..................................... 136/201, 203, 136/205, 236.1, 241

[56] References Cited

U.S. PATENT DOCUMENTS

| | | | |
|---|---|---|---|
| 4,149,025 | 4/1979 | Niculescu | 136/206 |
| 4,256,792 | 3/1981 | Koepke et al. | 428/119 |
| 4,276,440 | 6/1981 | Cannelli | 136/206 |
| 4,276,441 | 6/1981 | Wilson | 136/206 |
| 4,363,928 | 12/1982 | Wilson | 136/206 |
| 4,382,154 | 5/1983 | Thery et al. | 136/206 |
| 4,402,185 | 9/1983 | Perchak | 62/3 |
| 4,438,291 | 3/1984 | Eichelberger et al. | 136/236 R |
| 4,465,895 | 8/1984 | Verner et al. | 136/225 |
| 4,491,679 | 1/1985 | Moore | 136/203 |
| 4,500,741 | 2/1985 | Morimoto et al. | 136/206 |
| 4,500,742 | 2/1985 | Morimoto et al. | 136/206 |
| 4,588,520 | 5/1986 | Jayadev et al. | 252/512 |
| 4,650,919 | 3/1987 | Benson et al. | 136/212 |
| 4,710,588 | 12/1987 | Ellion | 136/206 |
| 4,720,362 | 1/1988 | Gentilman et al. | 264/1.2 |
| 4,859,250 | 8/1989 | Buist | 136/225 |
| 4,935,684 | 6/1990 | Watanabe | 318/729 |
| 4,946,511 | 8/1990 | Shiloh et al. | 136/212 |
| 4,971,632 | 11/1990 | Rowe | 136/212 |
| 4,983,225 | 1/1991 | Rowe | 136/201 |
| 4,992,235 | 2/1991 | Tokiai et al. | 419/23 |
| 5,009,717 | 4/1991 | Komabayashi et al. | 136/201 |
| 5,028,988 | 7/1991 | Porter et al. | 357/81 |
| 5,032,897 | 7/1991 | Mansuria et al. | 357/81 |
| 5,069,868 | 12/1991 | Tokiai et al. | 419/23 |
| 5,103,286 | 4/1992 | Ohta et al. | 357/68 |
| 5,156,688 | 10/1992 | Buhler et al. | 136/211 |
| 5,220,189 | 6/1993 | Higashi et al. | 257/467 |
| 5,241,828 | 9/1993 | Kapitulnik | 62/3.2 |
| 5,246,504 | 9/1993 | Ohta et al. | 136/201 |
| 5,288,336 | 2/1994 | Strachan et al. | 136/200 |
| 5,318,743 | 6/1994 | Tokiai et al. | 419/38 |
| 5,393,351 | 2/1995 | Kinard et al. | 136/225 |
| 5,434,744 | 7/1995 | Fritz et al. | 361/704 |
| 5,441,599 | 8/1995 | Horn et al. | 136/203 |
| 5,515,683 | 5/1996 | Kessler | 62/3.7 |
| 5,637,921 | 6/1997 | Burward-Hoy | 257/712 |
| 5,712,448 | 1/1998 | Vandersande et al. | 136/203 |

*Primary Examiner*—Kathryn Gorgos
*Assistant Examiner*—Thomas H Parsons
*Attorney, Agent, or Firm*—DeLio & Peterson, LLC; Robert Curcio; Aziz M. Ahsan

[57] ABSTRACT

Thermoelectric devices having enhanced thermal characteristics are fabricated using multilayer ceramic (MLC) technology methods. Aluminum nitride faceplates with embedded electrical connections provide the electrical series configuration for alternating dissimilar semiconducting materials. Embedded electrical connections are formed by vias and lines in the faceplate. Methods are employed for forming tunnels through lamination and etching. A portion of the dissimilar materials are then melted within the tunnels to form a bond. Thermal conductivity of the faceplate is enhanced by adding electrically isolated vias to one surface, filled with high thermal conductivity metal paste. A low thermal conductivity material is also introduced between the two high thermal conductivity material faceplates. Alternating semiconducting materials are introduced within the varying thermal conductivity layers by punching vias within greensheets of predetermined thermal conductivity and filling with n-type and p-type paste. Alternating semiconducting materials may also be patterned in linear or radial fanout patterns through screening techniques and lamination of wire structures. A liquid channel within the faceplate is used to enhance thermal energy transfer. Thermoelectric devices are physically incorporated within the IC package using MLC technology.

30 Claims, 20 Drawing Sheets

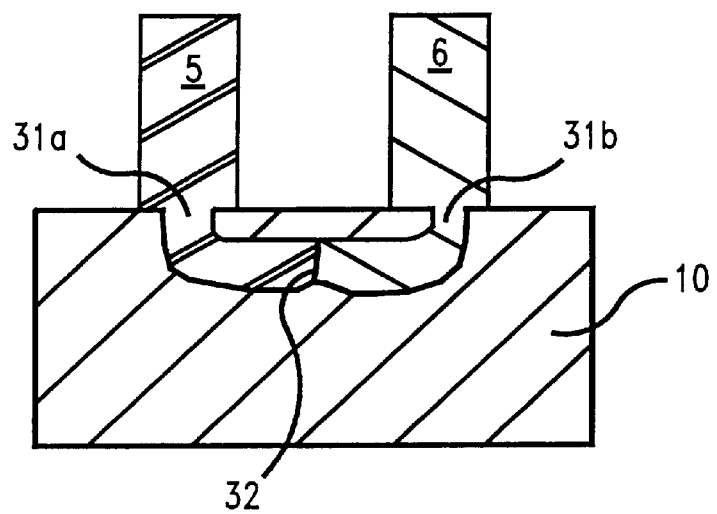
FIG. 4c
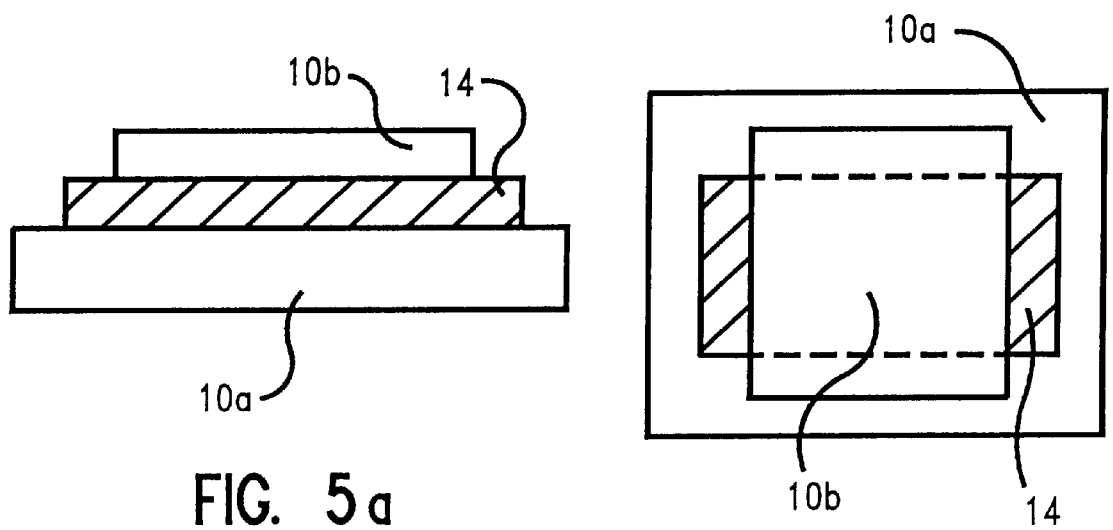
FIG. 5a
FIG. 5b
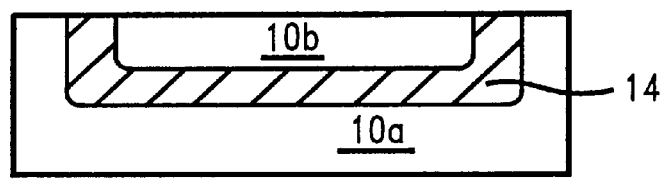
FIG. 5c

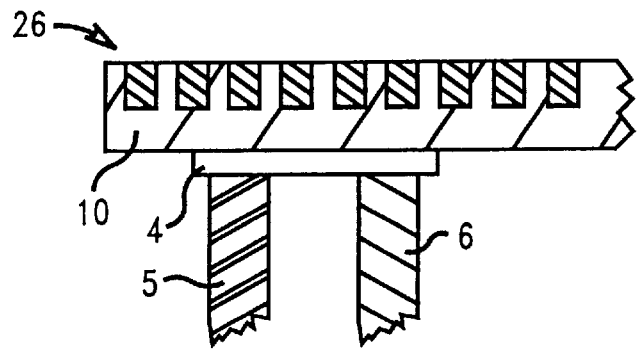
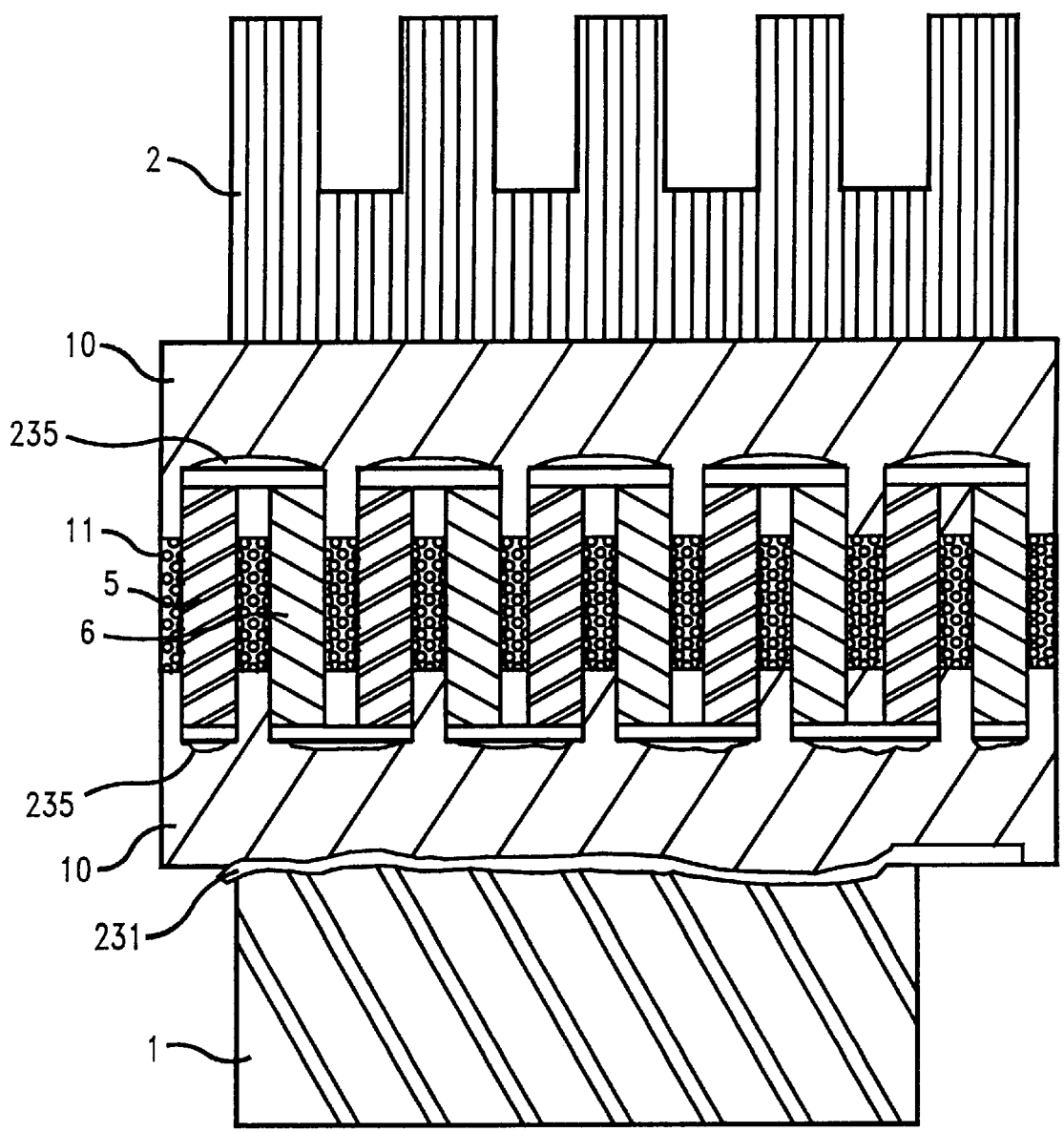

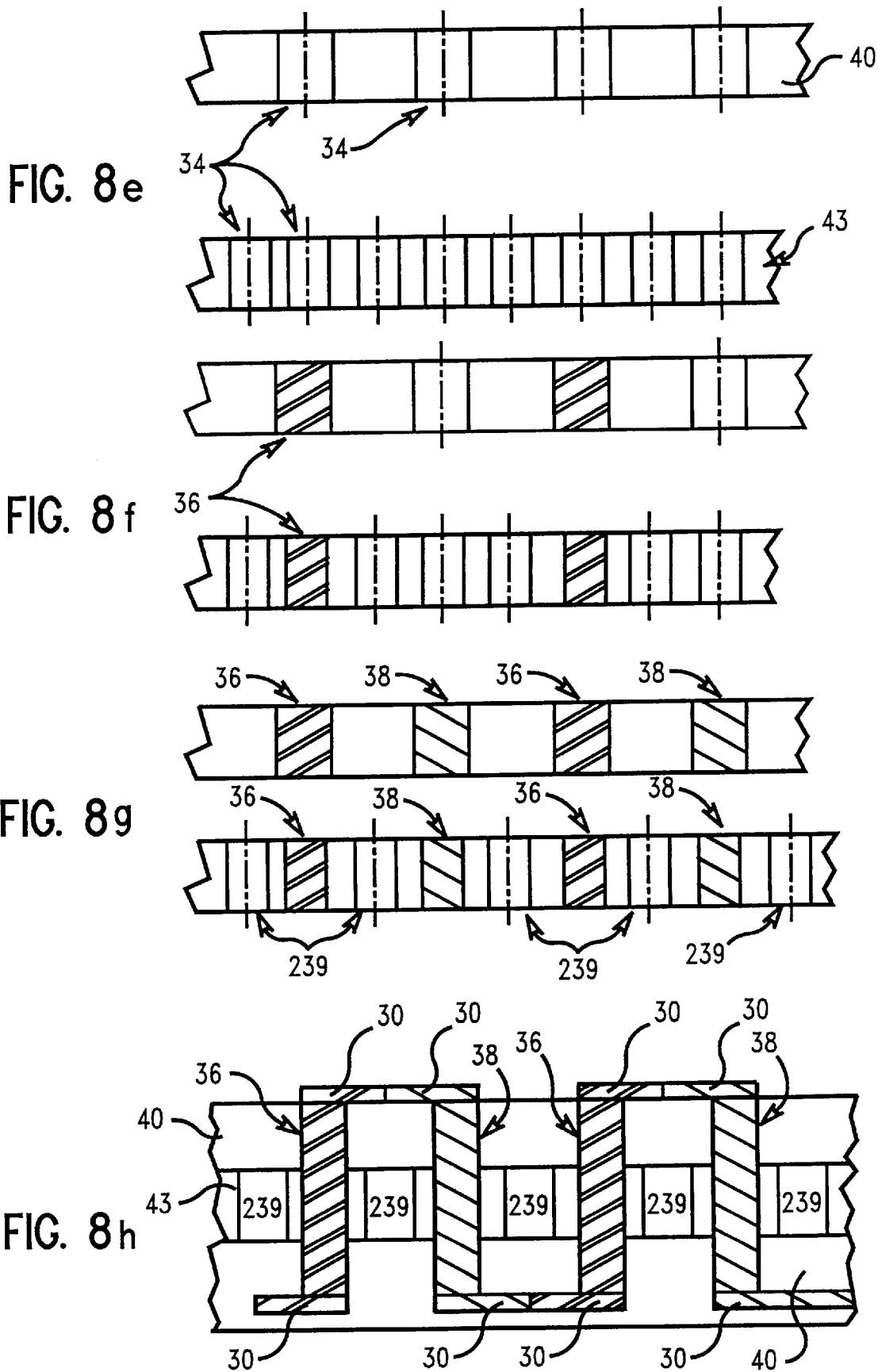

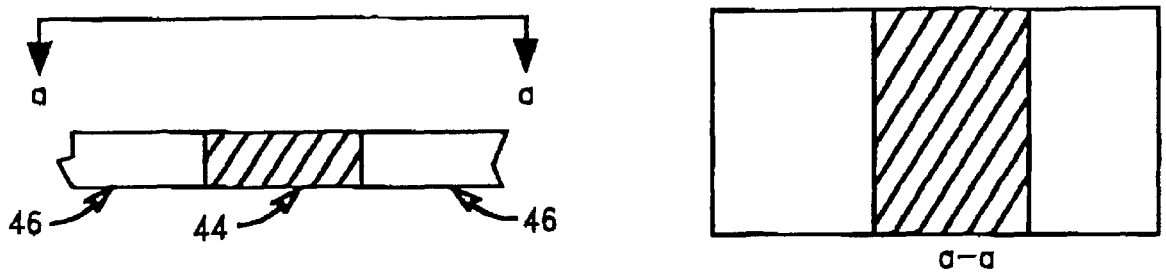
FIG. 9 g
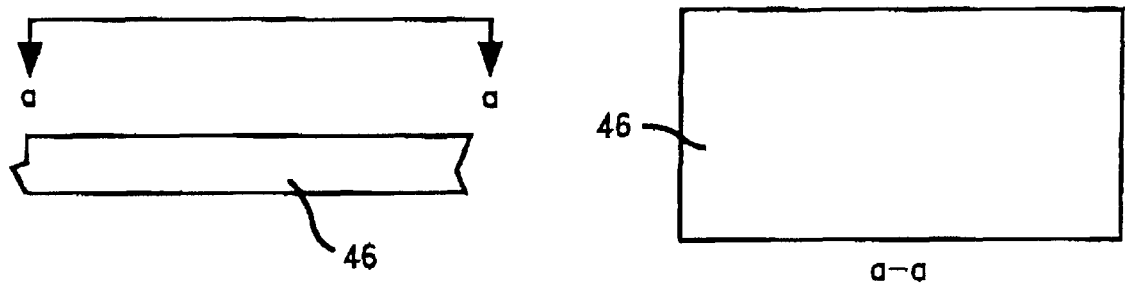
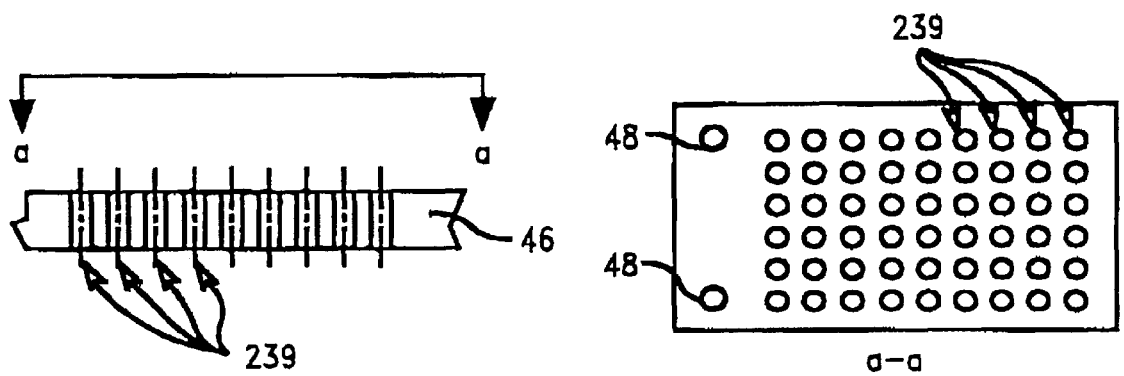
FIG. 9 i

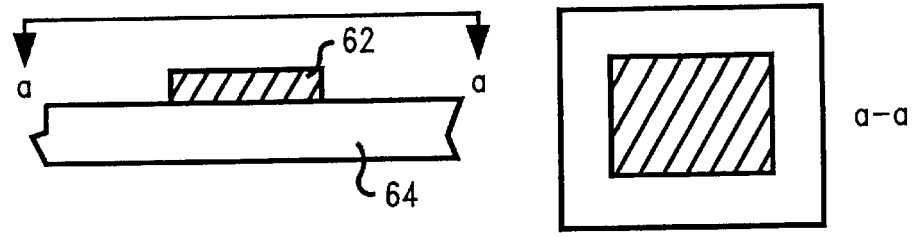
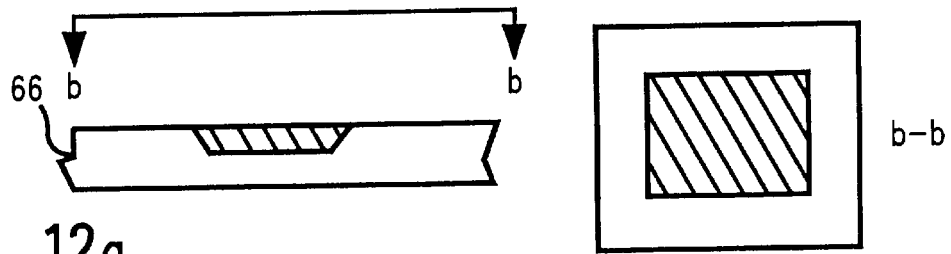
FIG. 12a
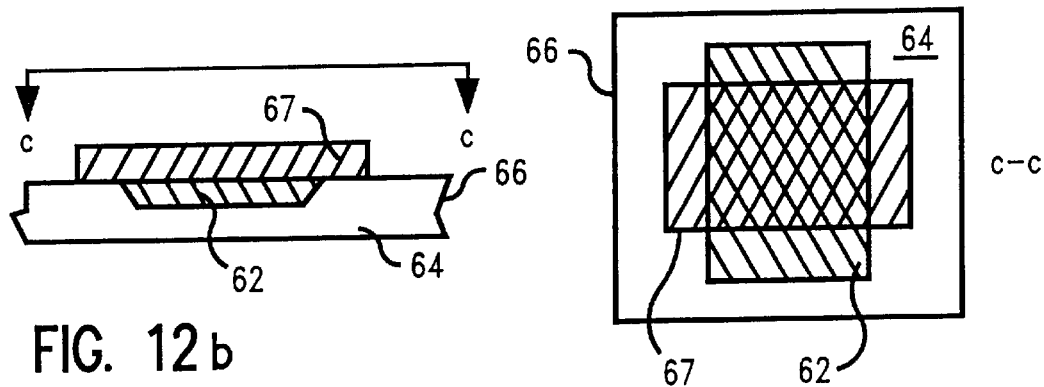
FIG. 12b
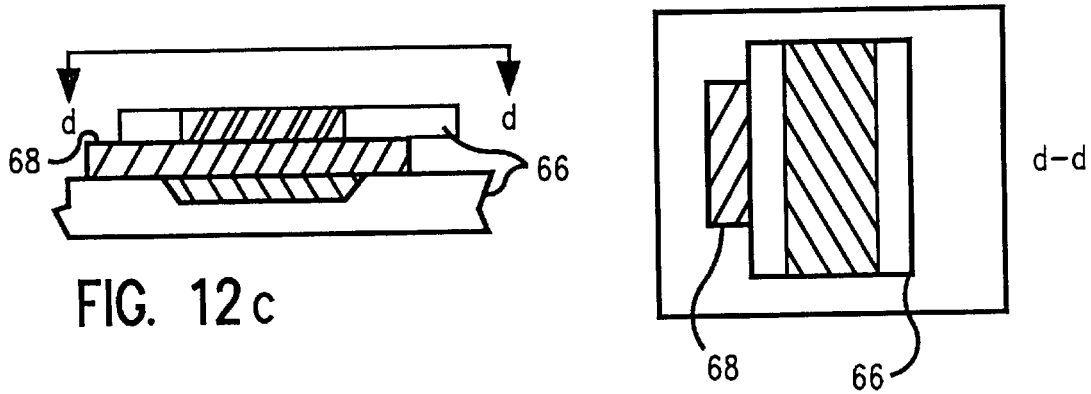
FIG. 12c
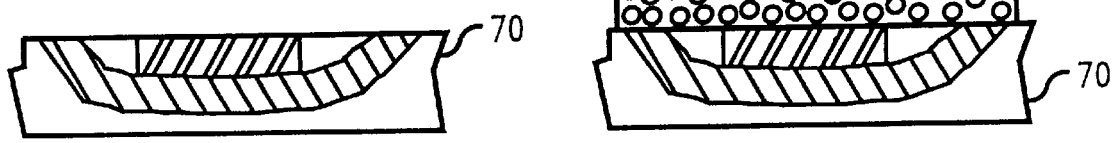
FIG. 12d
FIG. 12e

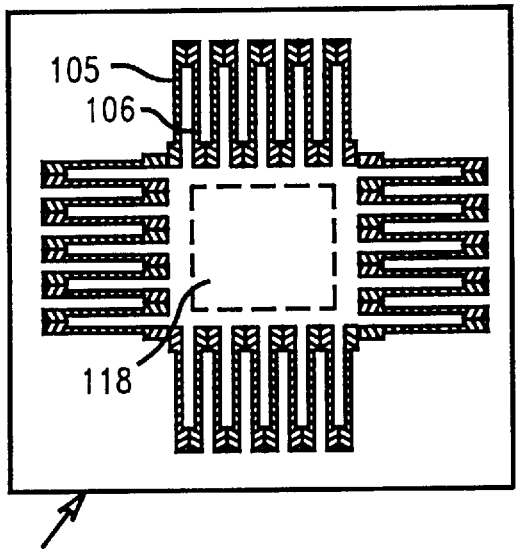
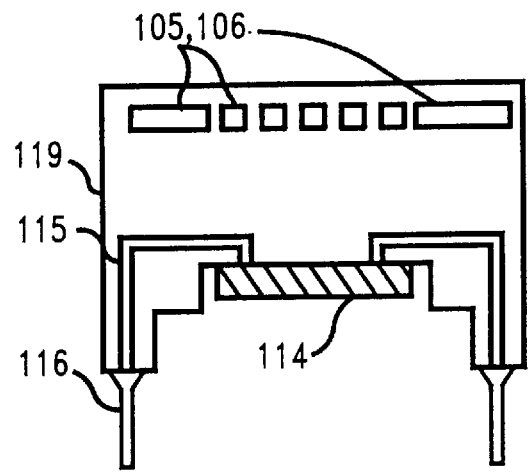
FIG. 15a    FIG. 15b
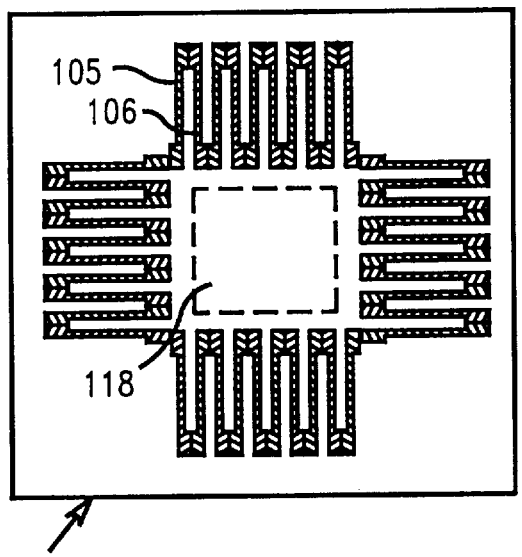
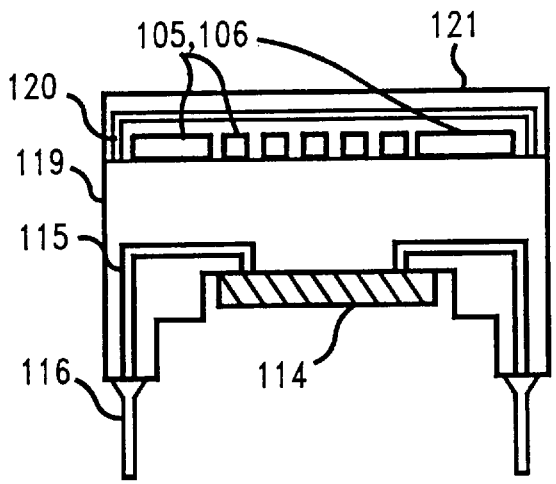
FIG. 16a    FIG. 16b

THERMOELECTRIC DEVICES AND METHODS FOR MAKING THE SAME

BACKGROUND OF THE INVENTION

1. Field of the Invention

The present invention is related to solid-state electronic heat pumps, commonly referred to as thermoelectric devices. More particularly, the present invention is related to different thermoelectric device configurations and the methods for making the same.

2. Description of Related Art

A thermoelectric device is capable of generating electricity if its two ends are held at different temperatures. Conversely, applied electrical current will induce a temperature differential between its two ends. Thus, a thermoelectric device is a heat pump which transfers heat by electric current. The principles of thermoelectricity are utilized in power generation, thermocouples, and refrigeration.

Current designs of commercially available thermoelectric devices have efficiencies too low to warrant use in cooling applications with high power microcircuits. However, the use of high thermal conductivity materials along with unique applications of multilayer ceramic technology may be adapted to provide thermoelectric devices with enhanced thermal performance. These devices will be better suited for power generation, cooling integrated circuit chips, and other temperature control applications.

Typically, a thermoelectric device contains p-type and n-type semiconducting materials sandwiched between two ceramic plates; an upper and lower faceplate or carrier plate. The faceplates typically have high electrical resistivity and low thermal conductivity. Situated between the faceplates are a number of Peltier couples, formed by joining p-type and n-type semiconductor elements. These couples are arranged in a two-dimensional array, thermally in parallel, and connected by conductors (braze, solder, and the like) so as to be electrically in series. Typically, a device being cooled is placed in thermal contact with the cold faceplate and a heat sink is placed in contact with the hot faceplate.

The efficiency of a thermoelectric device can be expressed in terms of a figure of merit (Z), defined by the equation:

$$Z = S^2 \sigma / \kappa$$

where,

Z is expressed in units $\times 10^3$/K

S is the Seebeck coefficient in $\mu V/^\circ$ C.

$\kappa$ is the thermal conductivity in mW/cm-K $\sigma$ a is the electrical conductivity in $(\Omega\text{-cm})^{-1}$ Note that a 1° C. difference is equal to 1K, the unit of absolute temperature. From the above equation, it can be ascertained that in order for a material to be efficient for thermoelectric power conversion, it is important to allow charge carriers to diffuse easily across the multiple Peltier couples while maintaining a temperature gradient. That is, there must be a relatively high value for the Seebeck coefficient (S), a high electrical conductivity (a), and a low thermal conductivity (K). When two dissimilar metals (conductors) or semiconductors having different Seebeck potential or Fermi energy levels are in contact at each end, a voltage is obtained if the ends are at different temperatures. This is known as the Seebeck effect. The Seebeck effect is the principle behind thermocouples and power generation devices. In thermocouples, voltages in the millivolt range are typically measured for temperature differences of a few hundred degrees Celsius. If a large number of these junctions are arranged thermally in parallel, electrically in series, and the two ends are held at different temperatures, electrical power at useful voltage is generated.

In contrast, for the Peltier effect, if one applies a current, a temperature difference is then realized. The Peltier effect causes absorption or liberation of heat when current flows across the junction of two dissimilar materials. As electrons flow from a p-type semiconductor to an n-type semiconductor an energy gap or "hurdle" is traversed. Thermal energy is absorbed as electrons overcome this energy hurdle and this junction is cooled. Conversely, as electrons flow from an n-type semiconductor to a p-type semiconductor electrons "fall" down the energy gap and thus release heat. This release will locally heat the junction.

Employing the latest advances in multilayer ceramic technology to thermoelectric device design provides benefits that enable the maximization of heat transfer, provides a device which is physically stronger, incorporates a higher density of interconnects, better protects against exposure to the elements, and enables the thermoelectric devices to be incorporated directly into an integrated circuit package. These advances will provide thermoelectric devices far superior to those in the prior art.

In U.S. Pat. No. 4,946,511 issued to Shiloh et al. on Aug. 7, 1990, entitled "THERMOELECTRIC DEVICES", a thermoelectric device comprising an array of thermoelectric rods of two different materials is taught, where the rods have an alternating arrangement between two carrier plates with each carrier plate being a plurality of discrete conductive metal junctions. In Shiloh, each carrier plate has a nickel plated copper junction on its surface for electrical connection to the thermoelectric rods. Thus, the electrical junctions remain exposed to the environment.

Similarly, in U.S. Pat. No. 4,465,895, issued to Verner, et al., on Aug. 14, 1984, entitled, "THERMOELECTRIC DEVICES HAVING IMPROVED ELEMENTS AND ELEMENT INTERCONNECTS AND METHOD OF MAKING SAME", electrical connection straps are attached to alternating semiconductor rods. However, in one embodiment of Verner, a ceramic potting compound fills the voids between the alternating elements. The compound insulates the elements and protects them from contamination. Although the conductive straps of this design are insulated from environmental effects, they still remain situated on the external surface of the carrier plates.

In U.S. Pat. No. 5,637,921 issued to Burward-Hoy on Jun. 10, 1997, entitled, "SUB-AMBIENT TEMPERATURE ELECTRONIC PACKAGE", two thermoelectric devices are arranged in series to cool an integrated circuit chip. However, the devices remain as separate units, attached to a heat sink or to a package.

In U.S. Pat. No. 4,402,185 issued to Perchak on Sep. 6, 1983, entitled, "THERMOELECTRIC (PELTIER EFFECT) HOT/COLD SOCKET FOR PACKAGED I.C. MICROPROBING", a heat pumping apparatus is described for cooling an IC chip. Two stages of thermoelectric devices are used. However, Perchak teaches the IC chip to be first thermally connected to an aluminum block.

In U.S. Pat. No. 5,032,897 issued to Mansuria et al., on Jul. 16, 1991, entitled, "INTEGRATED THERMOELECTRIC COOLING", the electronic package is adhered to a thermoelectric device, which is then attached to an IC chip. The cold plate of the thermoelectric device is attached directly to the chip, and any consideration for I/O must be done on the opposite side of the chip. Thus, any thermal energy generated by $I^2R$ heating of lines in the ceramic package will not be drawn away by this thermoelectric device. Consequently, there remains a need to incorporate multilayer ceramic technology in the design of thermoelectric devices in order to fully realize the greatest potential of thermal efficiency.

In U.S. Pat. No. 4,983,225 issued to Rowe on Jan. 8, 1991, entitled, "PROCESS OF MANUFACTURING MINIATURE THERMOELECTRIC CONVERTERS," a method of manufacturing thermoelectric devices is taught. Alternative ion implantation of either n-type or p-type semiconducting materials is used, resulting in a series of Peltier couples being laid out on the surface of a semi-insulating material. This invention, however, is unable to use both high and low thermal conductivity substrates within the device. Furthermore, the ability to create a dense stack of couples in the dimension normal to the substrate is limited by the thickness of the substrate, which must be thick enough to have considerable handling strength.

In U.S. Pat. No. 4,363,928, issued to Wilson on Dec. 14, 1982, entitled, "THERMOELECTRIC GENERATOR PANEL AND COOLING DEVICE THEREFOR," the means of fashioning a thermoelectric device by printing inks of different metals on the surface of a ceramic substrate is taught. This method, however, is limited in the density of Peltier couples that can be provided in the direction normal to the surface of the plane, as the substrates must be stacked on top of each other and thick enough to provide sufficient handling strength. Also, each couple is exposed on two or three sides, providing for inefficient thermal conduction and exposure to condensation from the atmosphere. Lastly, the thermal conductivity of the substrate between the hot and cold side remains uncontrolled.

In U.S. Pat. No. 5,156,688 issued to Buhler, et al., on Oct. 8, 1992, entitled, "THERMOELECTRIC DEVICE," a method of manufacturing a thermoelectric device for power generation is taught, with metal junctions buried between two layers of oxide on a semiconductor substrate. However, the hot and cold sides of the device are necessarily in close proximity of each other. Additionally, the Peltier couples in this device must be formed by micro-circuit fabrication processes.

Bearing in mind the problems and deficiencies of the prior art, it is therefore an object of the present invention to provide a thermoelectric device having improved thermoelectric characteristics, and method for making the same.

It is another object of the present invention to provide a thermoelectric array and method for the manufacture of the same having design improvements that make use of multilayer ceramic technology.

A further object of the invention is to maximize the heat flow from the thermoelectric device to the thermal sink.

Another object of the invention is to maximize the heat flow from the object to be cooled to the thermoelectric device.

Yet another object of the invention is to minimize the heat flow between the hot and cold ends of the thermoelectric device.

A further object of the present invention is to provide a thermoelectric device having improved conduction at the electrical and thermal junctions.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a thermoelectric device comprising: a plurality of blocks of two different materials arranged thermally in parallel, electrically in series; a lower plate of high thermal conductivity, having a top surface, a bottom surface, and a plurality of electrically conductive connectors inside the plates, forming electrical connections for the plurality of blocks on the top surface; and, an upper plate of high thermal conductivity, having a top surface, a bottom surface, and a plurality of electrically conductive connectors inside the plates, forming electrical connections for the plurality of blocks on the bottom surface. The thermoelectric device may further comprise a heat sink. Additionally, this device may further include a low thermal conductivity material plate such that the high thermal conductivity plates have the low thermal conductivity material plate there between. The plurality of blocks comprise alternating blocks of n-type and p-type semi-conducting conducting materials, different metals, or metal alloys having different Seebeck coefficients. The thermoelectric device may also have high thermal conductivity plates comprised of aluminum nitride material. The electrical connections may include non-cosinterable materials. The thermal conductivity of the lower plate and/or the upper plate can be enhanced by further including electrically isolated features formed in the bottom surface. The isolated features are formed by punching vias in the plates such that voids are generated during sintering. The isolated features consist of high thermal conductivity metal paste or metal paste yielding a low theoretical density during sintering. The metal paste, yielding a low theoretical density during sintering, is etched out and backfilled with a high thermal conductivity metal. Additionally, the high thermal conductivity metal is selected from the group consisting of copper, gold, or silver.

In a second aspect, the present invention is directed to a thermoelectric device comprising: a plurality of blocks of at least two different materials arranged thermally in parallel, electrically in series; a lower aluminum nitride plate of high thermal conductivity, having a top surface and a plurality of electrically conductive vias and lines, forming electrical connections for the plurality of blocks on the top surface; and, an upper aluminum nitride plate of high thermal conductivity, having a bottom surface and a plurality of electrically conductive vias and lines, forming electrical connections for the plurality of blocks on the bottom surface. A low thermal conductivity material plate may be placed between the high thermal conductivity plates. The thermoelectric device further includes a plurality of blocks comprising alternating blocks of n-type and p-type semi-conducting materials.

In a third aspect, the present invention relates to a method for making a thermoelectric device comprising: a) arranging a plurality of blocks of two different materials thermally in parallel; b) forming a plurality of electrically conductive connectors inside a lower plate of high thermal conductivity, having a lower plate top surface and a lower plate bottom surface, with the electrically conductive connectors available for electrical connection on the lower plate top surface; c) forming a plurality of electrically conductive connectors inside an upper plate of high thermal conductivity, having an upper plate top surface and an upper plate bottom surface, with the upper plate available for electrical connection on the upper plate bottom surface; and, d) attaching the plurality of blocks to the electrically conductive connectors on the lower plate top surface and the upper plate bottom surface such that the blocks are connected electrically in series. The method further includes arranging a plurality of alternating blocks of two different metals or two different metal alloys having different Seebeck coefficients. The method of the steps (b) and (c), forming the electrically conductive connectors, includes the steps of:

1) forming tunnels with access openings within the upper plate bottom surface and the lower plate top surface;
2) placing the plurality of blocks having predetermined melting temperatures over the tunnel access openings; and,
3) applying heat at approximately the melting temperatures of the plurality of blocks such that a portion of the blocks flow through the access openings within the tunnels thereby electrically connecting the blocks in series.

Step (1), forming the tunnels, may comprise the steps of:

1) providing the upper and lower plates with high thermal conductivity material having lines and vias filled with paste; and,
2) etching the paste out of the vias to form the tunnels with the access openings, or alternatively, step (1), forming the tunnels, may comprise:
1) providing the upper and lower plates with high thermal conductivity material having lines and vias filled with a fugitive paste; and,
2) burning out the fugitive paste during sintering.

Electrical connections are then made by flowing a portion of the blocks through the access openings, which may be performed by fluxing, brazing, sputtering, or wetting. The paste is preferably selected from the group consisting of: tungsten, molybdenum, large particle size tungsten, tungsten with activated sintering agents, tungsten paste prone to low density upon sintering, and tungsten with the addition of $3CaO.Al_2O_3$. The activated sintering agents typically comprise Co, Ni, and Fe. The steps (b) and (c), forming a plurality of electrically conductive connectors, include the steps of:

1) providing an aluminum nitride greensheet and an aluminum nitride plate;
2) applying a paste to a side of the greensheet and combining the greensheet and the plate having the paste therebetween;
3) laminating the combined greensheet and plate having the paste therebetween; and,
4) etching away the paste to form the tunnels.

In a fourth aspect, the present invention relates to a method of patterning alternating blocks of n-type and p-type semi-conducting materials in a thermoelectric device, comprising the steps of: a) providing a substrate of ceramic greensheets having an upper layer, a middle layer, and a lower layer, wherein the upper and lower layers have a different thermal conductivity than the middle layer; b) punching vias in the substrate; c) filling the punched vias with alternating n-type and p-type semiconducting powdered material; and, d) stacking the greensheets according to the thermal conductivity, such that the middle layer of the substrate is a lower thermal conductivity material sandwiched between the upper and lower layers of high thermal conductivity material.

Step (d), stacking the greensheets, further includes first prelaminating the middle layer within one of the layers of high thermal conductivity. The upper and lower layers may also comprise the high thermal conductivity material of aluminum nitride. The middle layer of low thermal conductivity material is selected from the group consisting of: greensheets containing aluminum nitride of large particle size distribution; greensheets containing aluminum nitride with high weight percentage oxygen; greensheets containing aluminum nitride with no sintering additives; greensheets containing a plurality of unfilled vias; greensheets containing zirconia, greensheets containing alumina, greensheets containing a fugitive phase, and greensheets containing a plurality of blind vias wherein the vias remain as pores after sintering. The different thermal conductivity includes having the upper and lower layers with thermal vias added to the layers.

In a fifth aspect, the present invention relates to a method of patterning alternating blocks of different materials in a thermoelectric device, comprising the steps of: a) layering a greensheet of low thermal conductivity on a greensheet of high thermal conductivity; b) punching vias within the greensheets; c) filling the vias with electrically conductive material; d) screening the alternating blocks of different materials on the layered greensheet; e) stacking the screened, layered greensheets on top of one another to form a multiple layered substrate; and, f) laminating and sintering the multiple layered substrate. Step (d), screening alternating blocks of different materials, further comprises screening the blocks in alternating lines or in an alternating radial fanout pattern.

In a sixth aspect, the present invention relates to a method of patterning alternating blocks of n-type and p-type semi-conducting materials in a thermoelectric device, comprising the steps of: a) forming metal lines by applying a refractory metal to a thermoelectric block such that the metal and the block are cosinterable and the metal lines form as porous and open structures; b) etching the metal with an etchant; and, c) heating at least two different semiconducting materials close to the melting point such that the semiconducting material flows within the porous metal lines. Step (a), forming metal lines, further comprises forming parallel lines connected at the ends, or in a radial pattern.

In a seventh aspect, the present invention relates to a method of making a thermoelectric device, comprising: a) providing a ceramic greensheet layer; b) forming different cosinterable materials in the shape of wires; c) arranging the wires in an alternating pattern on the greensheet by connecting the wires end-to-end; d) layering multiple greensheets fabricated in accordance with the steps (a)-(c) for a predetermined number of the greensheet layers; and, e) laminating and sintering the cosinterable materials with the greensheet layers.

In an eighth aspect, the present invention relates to a thermoelectric device capable of transferring thermal energy into a liquid, comprising: a heat sink; a plurality of blocks of two different materials arranged thermally in parallel, electrically in series; a lower plate of high thermal conductivity, having a top surface, a bottom surface, and a plurality of electrically conductive connectors forming electrical connections for the plurality of blocks on the lower plate top surface; a high thermal conductivity ceramic block attached directly to the plurality of blocks of at least two different materials; and, a plurality of channels within the ceramic block containing liquid therein for heat absorption. The ceramic block comprises an aluminum nitride ceramic, which may also comprise a protective oxide layer.

In a ninth aspect, the present invention relates to a thermoelectric device physically incorporated within an integrated circuit package, comprising: an integrated circuit microchip; an electronic package, having an upper surface and a lower surface, comprising of high thermal conductivity ceramic and conductive wires, such that when the package lower surface is attached to the integrated circuit microchip it functions as a conduction plate; a plurality of blocks of at least two different materials arranged thermally in parallel and electrically in series; means for electrically connecting one end of the plurality of blocks on the package upper surface; a faceplate having embedded lines and vias for electrically connecting the other end of the plurality of blocks; means for electrically connecting the microchip to the package; and, a heat sink attached to the plurality of blocks opposite the package. The plurality of blocks comprise alternating semiconducting materials in lines, or in a radial fanout pattern.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIG. 4c is an elevational cross-sectional view of the different semiconducting material brought to a melting temperature to form an electrical path within the tunnel.

FIG. 5a is an elevational cross-sectional view of a layer of metal paste in between two greensheets used to form embedded electrical connections within the faceplate.

FIG. 5b is a top view of FIG. 5a.

FIG. 5c is a view of the structure of FIG. 5a after lamination.

FIG. 6 is an elevational cross-sectional view of a portion of a thermoelectric device with electrically isolated metal filled thermal vias punched in a faceplate.

FIG. 7 is an elevational cross-sectional view of a thermoelectric device having a low thermal conductivity layer sandwiched between two layers of high thermal conductivity material.

FIG. 8e is a partial cross-sectional view of a thermoelectric device showing one exterior layered greensheet over a low thermal conductivity layered greensheet, both having punched vias.

FIG. 8f is the thermoelectric device of FIG. 8e with a portion of the punched vias filled.

FIG. 8g is the thermoelectric device of FIG. 8e with blind vias indicated.

FIG. 8h is a cross-sectional view of the thermoelectric device of FIG. 8g with semiconducting material connectors and blind vias.

FIG. 9g is an elevational cross-sectional view of the structure of FIG. 9e prelaminated from the side.

FIG. 9I is a cross-sectional view of a greensheet with vias punched therethrough.

FIG. 12a is an elevational cross-sectional view of a low thermal conductivity greensheet laminated within a high thermal conductivity greensheet.

FIG. 12b is an elevational cross-sectional view of the structure of FIG. 12a with n-type paste blanketed over the low thermal conductivity layer.

FIG. 12c is an elevational cross-sectional view of the structure of FIG. 12b with another layer of the alternating thermal conductivity material of FIG. 12a placed thereon.

FIG. 12d is an elevational cross-sectional view of the laminated structure of FIG. 12c.

FIG. 12e is an elevational cross-sectional view of the structure of FIG. 12d with p-type paste applied to one surface.

FIG. 15a is a plan view of a thermoelectric device with alternating semiconducting material in perpendicular lines in the plane of a ceramic package.

FIG. 15b is an elevational cross-sectional view of the thermoelectric device of FIG. 15a.

FIG. 16a is a plan view of a thermoelectric device with alternating semiconducting material in perpendicular lines and having an encapsulation lid.

FIG. 16b is an elevational cross-sectional view of the thermoelectric device of FIG. 16a.

DESCRIPTION OF THE PREFERRED EMBODIMENT(S)

Figure 1:
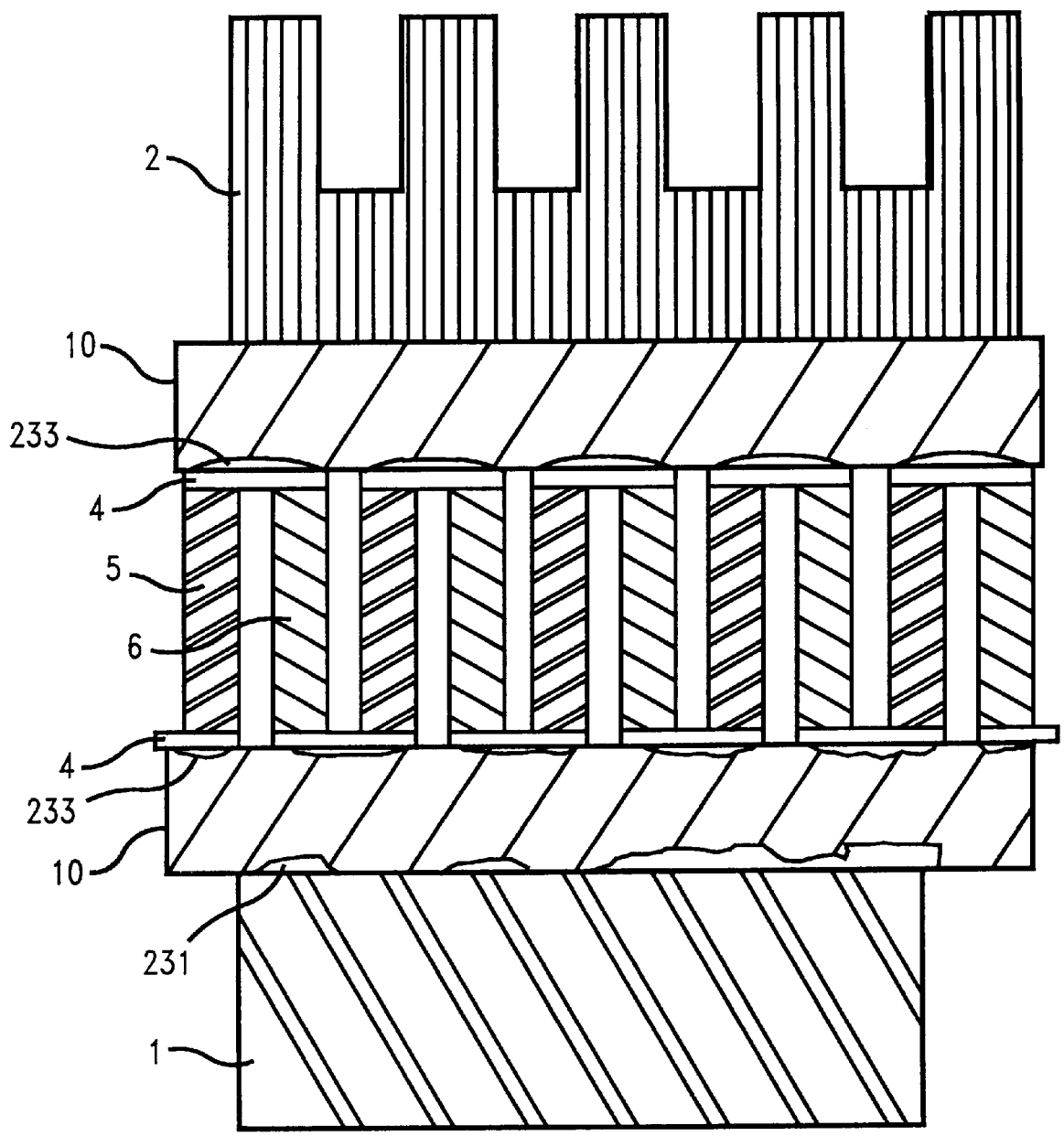
FIG. 1 is an elevational cross-sectional view of a thermoelectric device with electrical connections located on the surface of the faceplates.

In describing the preferred embodiment of the present invention, reference will be made herein to FIGS. 1–22 of the drawings in which like numerals refer to like features of the invention. Features of the invention are not necessarily shown to scale in the drawings.

Aluminum Nitride Faceplate

FIG. 1 depicts a thermoelectric device having heat sink 2, alumina faceplates 10, blocks of two different alternating materials 5 and 6 which may be dissimilar metals or different semiconducting materials, and brazed or solder connections 4 residing on top of a layer of refractory metal 233 on the faceplates 10. The refractory metal 233 may either be applied in a post-fire application or screened as a pad on a ceramic greensheet before sintering. The object to be cooled 1, typically an integrated circuit device, resides on the side of the thermoelectric device opposite heat sink 2. The semiconducting materials 5, 6 alternate within the structure, and are situated thermally in parallel. Electrical connections of these materials are made in series by the connections 4. A thermal grease 231 may sometimes be applied at the interface between the faceplate and the object to be cooled, and at the heat sink interface. Typically, the faceplates 10 are of an aluminum oxide-based ceramic material, which provides for low thermal conductivity. In order to enhance the electrical and thermal connections of a thermoelectric device where the n- and p-type material junctions connect to metal conductors, a high thermal conductivity material, preferably aluminum nitride (AlN), is used as the faceplate. The use of this material affords a significant advantage in heat flow over the current usage of aluminum oxide. Heat flow is determined from the expression:

$$Q = \Delta T \kappa A / x$$

where,

Q is the heat flow $\Delta T$ is the temperature difference $\kappa$ is the thermal conductivity (190 W/mK for AlN; 26 W/mK for $Al_2O_3$)

A is the surface area; and, x is the material thickness

Thus, with the significant difference in thermal conductivity, aluminum nitride provides for a 5 to 6 times greater capacity for heat flow than an aluminum oxide surface.

Embedded Electrical Connections

Figure 2:
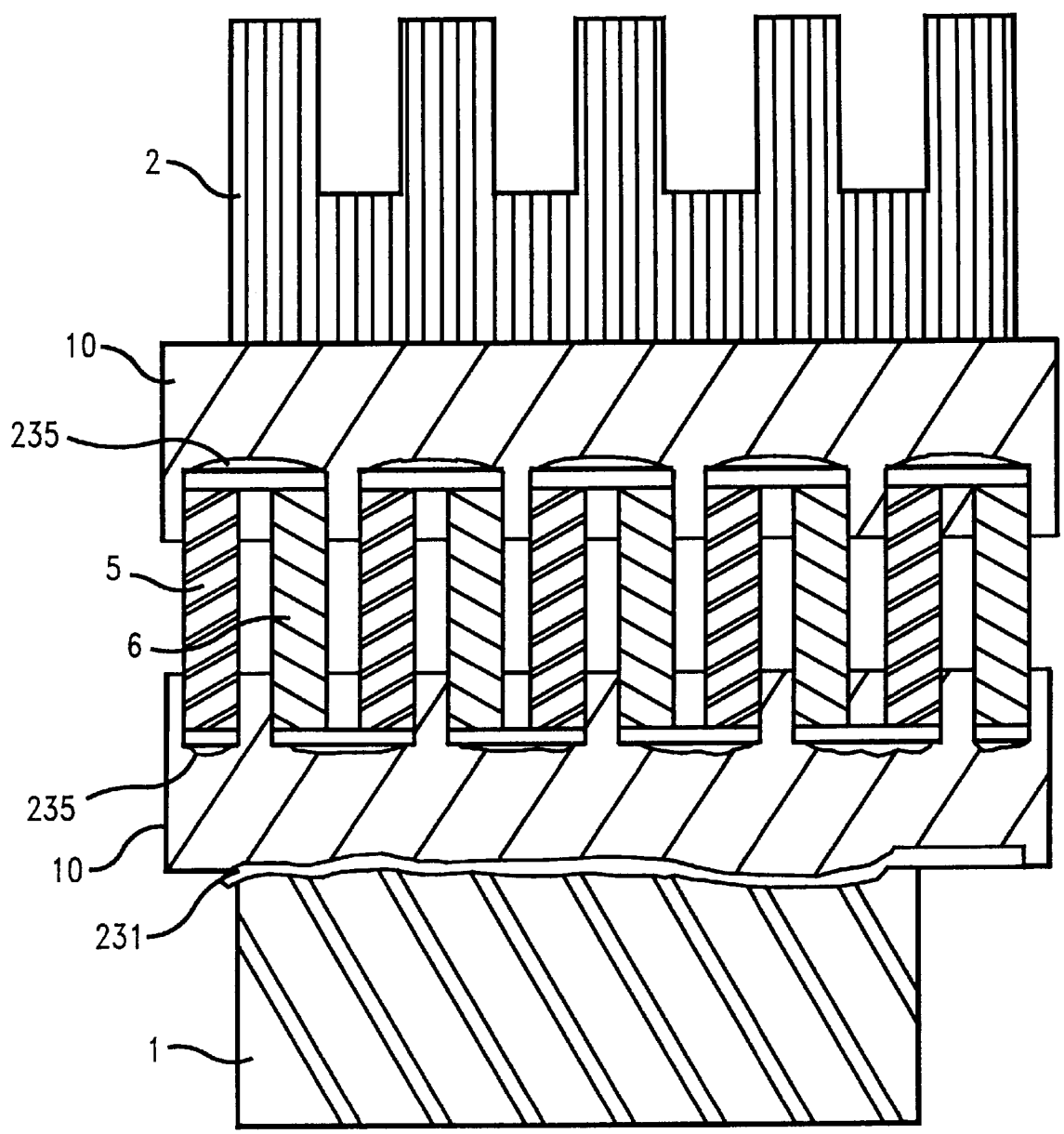
FIG. 2 is an elevational cross-sectional view of a thermoelectric device with electrical connections embedded within each faceplate.

In addition to using aluminum nitride for the refractory metal faceplates 10, as shown in FIG. 2, the electrical connections 4 of FIG. 1 that normally reside on the surface of the refractory metal may be embedded within the faceplate to provide for an environmentally protected, integrated thermoelectric device connecting structure 235. This preferred embodiment 235 may be implemented alone or used in conjunction with the aluminum nitride faceplates described above. The materials used for these connections are preferably non-cosinterable materials.

Figure 3:
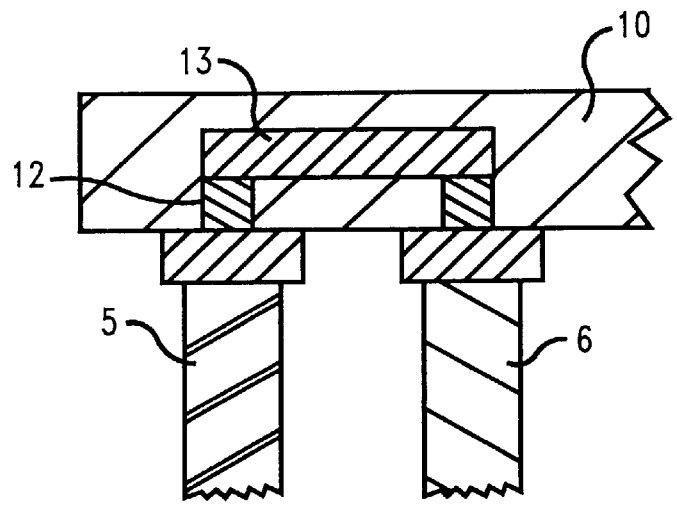
FIG. 3 is an elevational cross-sectional view of a portion of a electric device having vias and lines for electrical connections embedded within a faceplate.

A simple form of providing the embedded electrical connections within the faceplates of the thermoelectric device, depicted in FIG. 3, includes the use of vias 12 and lines 13 in the aluminum nitride faceplate 10. By providing electrical connections within the faceplate, heat transfer characteristics are enhanced as current flows to and from the alternating semiconducting materials.

Figure 4A:
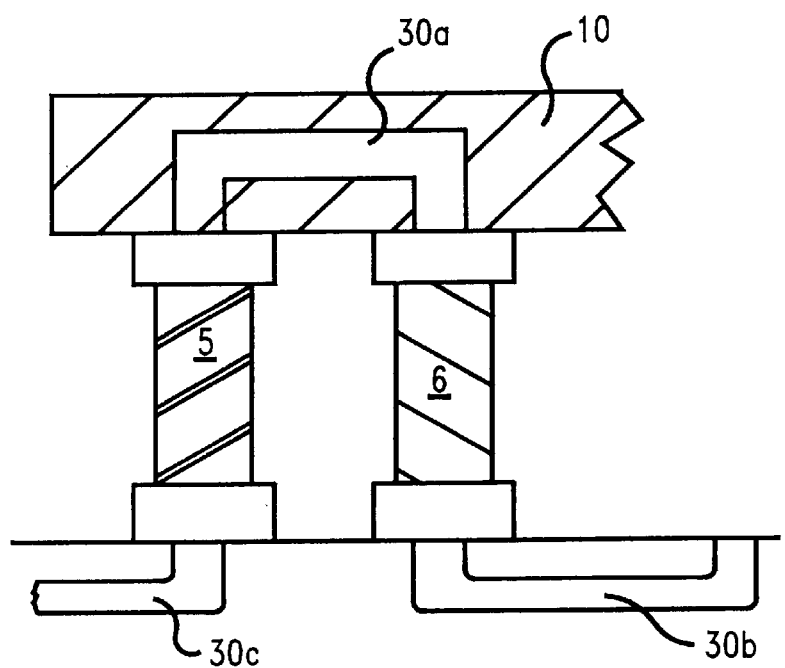
FIG. 4a is an elevational cross-sectional view of a portion of a thermoelectric device having filled tunnels for electrical connections in a faceplate.
Figure 4B:
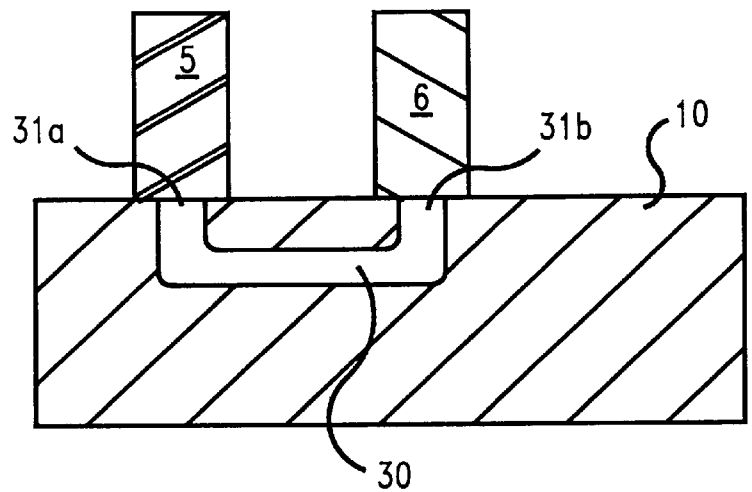
FIG. 4b is an elevational cross-sectional view of different semiconducting material placed on a faceplate over the tunnel openings.

Fabrication of vias 12 and lines 13 within faceplate 10 can be accomplished by the formation of tunnels 30a–c as shown in FIG. 4a. FIG. 4b depicts the alternating semiconducting materials (or dissimilar metals) 5, 6 placed on the aluminum nitride faceplate over the tunnel openings 31a,b. The semiconducting materials are then heated close to the melting point to form a connection 32 between the n- and p-type material within the tunnel, as shown in FIG. 4c. Flux, braze, sputtering, or wetting may be employed to facilitate this joining process.

FIG. 5 is representative of an alternative method that may be utilized to form electrical connections within the faceplates, specifically, building an electrical connection using tungsten paste prone to low density. As shown in FIG. 5a, a layer of paste 14, capable of being later etched away, is applied to the surface of an aluminum nitride faceplate 10a. A greensheet of aluminum nitride 10b is then placed over the layer of paste 14. A top-view of this arrangement is shown in FIG. 5b. The resultant structure is then laminated, yielding an aluminum nitride faceplate with a cavity of paste between its top and bottom surfaces, FIG. 5c. Preferably, a tungsten paste is used, however, molybdenum or other pastes that can be etched may also be considered. Other compositions which may be used for the tunnel include: 1) large particle size tungsten or molybdenum; 2) tungsten with activated sintering agents, such as Ni, Fe, and Co; 3) tungsten with the addition of $3CaO.Al_2O_3$; or, 4) a fugitive paste such as carbon. In the case of carbon, the paste is burned out in the sintering cycle. In the case of tungsten-based pastes, the paste is then removed by etching to reveal a tunnel within the aluminum nitride faceplate having tunnel openings 31a,b on the surface.

Enhancing the Thermal Conductivity of the Faceplate

The thermal conductivity of each faceplate 10 may also be increased by the addition of electrically isolated vias. As shown in FIG. 6, electrically isolated vias 26 are punched in the top layer of faceplate 10. The vias are either filled with high thermal conductivity metal paste, or with a metal paste which is designed to yield a low theoretical density during sintering. If the latter choice is implemented, the sintered blind via may be etched out or back filled with a high thermal conductivity metal, preferably copper, gold or silver.

The addition of high thermal conductivity metal to the faceplate allows for the enhanced propagation of thermal energy throughout this localized region, and also shortens the path length through the ceramic portion of the faceplate.

Method of Making a Ceramic of Varying Thermal Conductivity

In conjunction with the above described enhancements of thermal properties in the design of a thermoelectric device, the thermal conductivity of the device may be varied to direct and improve or reduce the flow of heat. A provision for high thermal conductivity material at the junctions and low thermal conductivity elsewhere provides for reduced thermal conductivity along the electrical path of the thermoelectric device. This in turn establishes a barrier against heat flow in one-dimension allowing for greater thermal energy transfer characteristics. Thus, as depicted in FIG. 7, a low thermal conductivity layer 11 is sandwiched between two layers of high thermal conductivity material 10. The low thermal conductivity layer may be introduced by any of several means: 1) the use of greensheets containing an aluminum nitride powder with a high starting oxygen content; 2) the use of greensheets containing an aluminum oxide based ceramic or any other ceramic material with a low bulk thermal conductivity; 3) the use of greensheets of any ceramic material with a large particle size or lacking a sintering aid such that a low percentage of theoretical density is achieved; 4) the use of greensheets of any ceramic material which contains a phase, such as a glass, which is then etched away after sintering; 5) the use of greensheets which have extra "blind" vias added to them, where the vias remain as isolated holes or pores after sintering; 6) the addition of fugitive ingredients to the greensheet, such as carbon or plastics, which are removed during the sintering process; 7) the use of greensheets having voids while in the green state (this may include punched vias which remain unfilled, either aligned in the stacking direction or staggered); or, 8) the use of greensheets with hollow spheres. The aforementioned voids may also be generated by embossing or dimpling greensheets in a manner that leaves open spaces in the sintered state.

The greensheets are layered in a high-low-high thermal conductivity pattern. The low thermal conductivity layer may also be prelaminated within a high thermal conductivity greensheet. The use of this ceramic multilayer technology maximizes the heat flow into the thermal sink, i.e., maximizes the heat flow from the object to be cooled, while minimizing the heat flow between the hot and cold sides of the thermoelectric device.

Figure 8A:
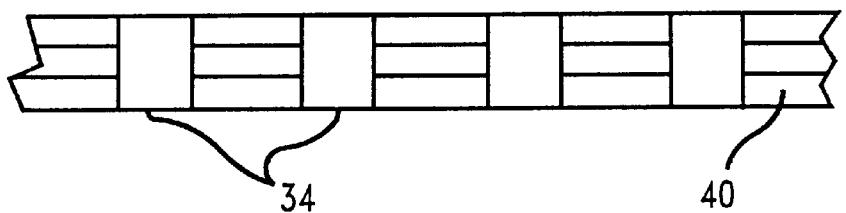
FIG. 8a is an elevational cross-sectional view of a layered greensheet of predetermined thermal conductivity with vias punched therethrough.
Figure 8B:
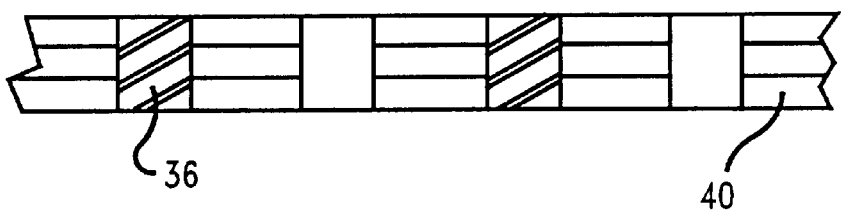
FIG. 8b is an elevational cross-sectional view of the layered greensheet of FIG. 8a with a paste filling alternating vias.
Figure 8C:
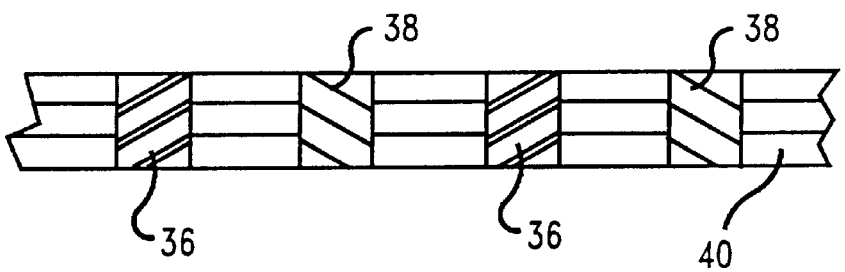
FIG. 8c is an elevational cross-sectional view of the layered greensheet of FIG. 8b with a second composition paste filling the remaining vias.

Method of Making Alternating Semiconducting Materials in a Thermoelectric Device The alternating n- and p-type materials, configured thermally in parallel and electrically in series, can be fabricated within varying thermal conductivity layers by using via technology from multilayer ceramic processing. First, vias 34 are punched within layered greensheets 40 of predetermined thermal conductivity, FIG. 8a. As shown in FIG. 8b, a paste containing one or more powders, preferably an n-type paste 36 is then filled in alternate vias. Another paste containing one or more powders, preferably p-type paste 38, is correspondingly filled within the remaining vias, FIG. 8c. These powders may include those listed in one of the following U.S. Patents, such as:

1) U.S. Pat. No. 5,241,828: InSb, HgCdTe, SnTe, GaAs, Ge, CdS, Si, GiaP, WSe$_2$, AlGe, InGe, NbSi, MoGe, AuGe, AgGe, and, AuSi;
2) U.S. Pat. No. 4,893,225: AuGe and ZnSn;
3) U.S. Pat. No. 5,069,868: Fe and Si;
4) U.S. Pat. No. 5,246,505: Bi and Te; and,
5) U.S. Pat. No. 4,061,505: Gd, Er, Se and Te.

Figure 8D:
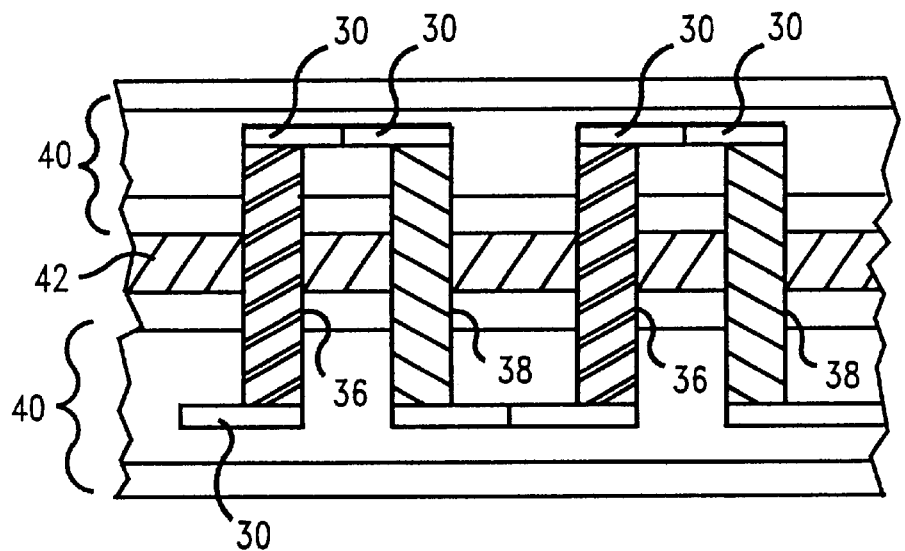
FIG. 8d is an elevational cross-sectional view of stacked greensheets of the structure of FIG. 8c with embedded electrical connections in the faceplates.

The layered greensheets 40 with filled vias, having high thermal conductivity properties, are then stacked, as shown in FIG. 8d, preferably with a low thermal conductivity layer 42, fabricated from the same punched-via process, and filled with alternating semiconducting materials, sandwiched between the two or more higher thermal conductivity layers. Although the preferred embodiment, having a low thermal conductivity layer 42 sandwiched between two high thermal conductivity layers, enhances the thermal energy transfer of the thermoelectric device, it is not a necessary condition to the successful implementation of ceramic multilayer technology for alternating n- and p-type semiconducting materials, nor is it necessary for the operation of the device. The aforementioned embedded electrical connections within the faceplates, connecting the alternating semiconducting materials, may also be employed in this design, and have been depicted as item 30 in FIG. 8d as an illustrative example.

FIG. 8e depicts a partial cross-sectional view of a thermoelectric device showing one exterior layered greensheet 40 with punched vias openings over a low thermal conductivity layer 43 also having vias 34. FIGS. 8f and 8g indicate the filling of these vias 36, 38 with some predetermined vias 239 left unfilled as "blind" vias. Lastly, FIG. 8h depicts a cross-sectional view of the preferred embodiment having a low thermal conductivity layer 43 with blind vias 239 sandwiched between the high thermal conductivity layers 40.

Methods for Patterning Alternating Thermoelectric Materials

The alternating thermoelectric materials may be positioned in a number of geometric patterns to accommodate various physical designs of thermoelectric devices and to optimize performance. Such patterns include configuring the conducting elements in lines or in a radial fanout.

The advantages of using multilayer ceramic technology in a thermoelectric device will be enhanced if a thermoelectric material system has a melting point higher than that of the densification temperature of the ceramic. If the thermoelectric material has a much higher melting point than the ceramic's densification temperature, as in the case of tungsten and glass ceramic, the metal may be incorporated in embedded connections in the form of wires into greensheets, laminated and sintered, without undergoing a change in shape. If the thermoelectric material has a melting temperature not much higher than that of the ceramic's densification temperature, it can be applied to the greensheet in powder form in a paste, and processed using traditional multilayer ceramic technology. Table I gives examples of thermoelectric material systems, Seebeck coefficients of the system, melting temperatures, and ceramic greensheet systems with which there is compatibility.

Alternating Buried Semiconductor or Metallic Lines

FIG. 9 represents a method for fabricating a line configuration in a thermoelectric device, using ceramic multilayer technology. First, as shown in FIG. 9a, a rectangular greensheet 44 is screened with one type of paste 5. Then, a second paste 6 is either screened next to paste 5 or on the back of a second greensheet, as shown in FIG. 9b. The resulting greensheet layer is depicted in FIG. 9c. Vias 48 are used to connect one layer of the assembly to another. In cross-section, the stacked, final product is represented in FIG. 9d.

The performance of the thermoelectric device is greatly reduced if there is significant heat flow from one set of junctions to the other. Thus, the device may be further improved by providing for variation in thermal conductivity across the length of conductors. This may be accomplished by introducing a zone of lower thermal conductivity, either by means of materials or by means of introducing voids.

The introduction of a lower thermal conductivity zone with a different material composition may be performed by one of two methods. First, a section of greensheet 44 with lower thermal conductivity material is obtained. This lower thermal conductivity material may be arrived at by a number of means, including: 1) the use of aluminum oxide or zirconia based ceramics; 2) the use of fugitive ingredients, such as carbon; 3) the use of high starting oxygen content or large particle size aluminum nitride; 4) the use of aluminum nitride without sintering aids; and, 5) the use of small hollow glass or polymeric spheres.

Figure 9A:
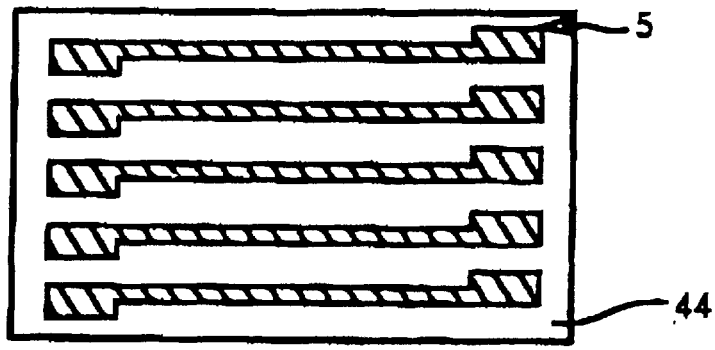
FIG. 9a is a top view of a thermoelectric device greensheet with n-type paste screened thereon.
Figure 9B:
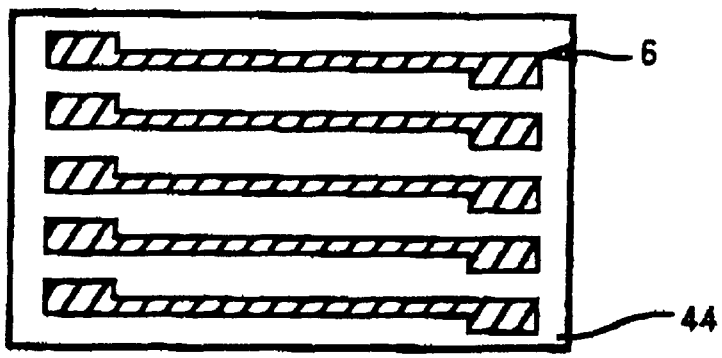
FIG. 9b is a top view of a thermoelectric device greensheet with p-type paste screened thereon.
Figure 9C:
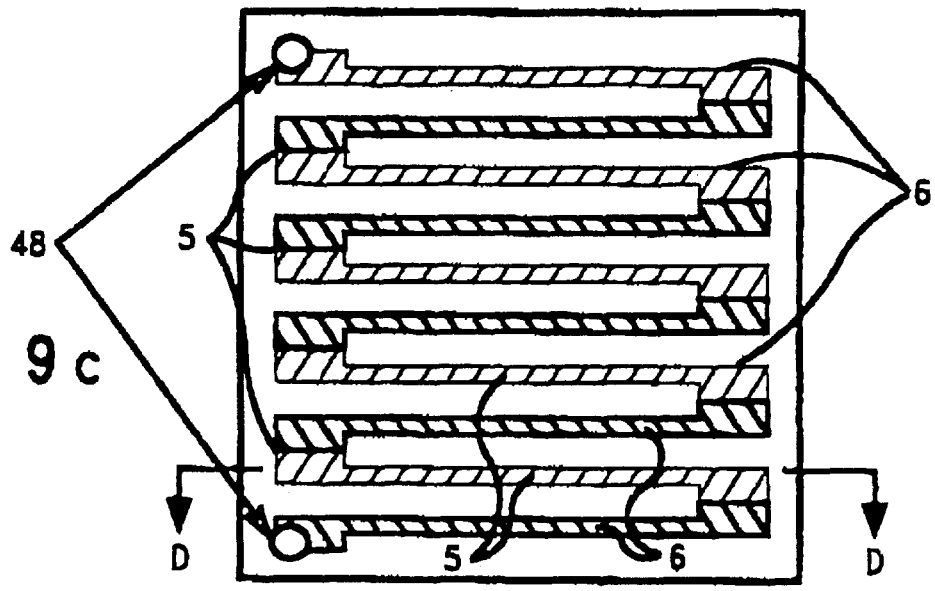
FIG. 9c is a top view of the resultant screened on semiconducting materials of FIGS. 9a and 9b.
Figure 9D:
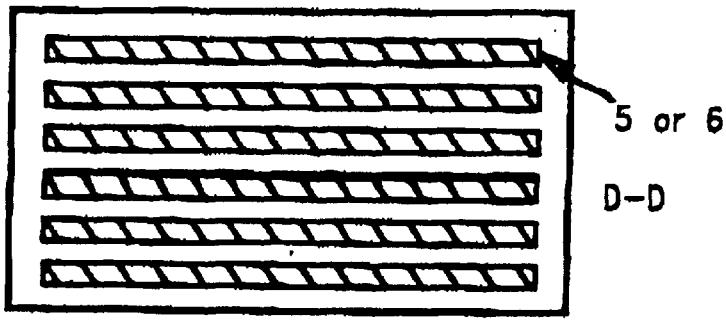
FIG. 9d is an elevational cross-sectional view of stacked layers of the structure of FIG. 9c
Figure 9E:
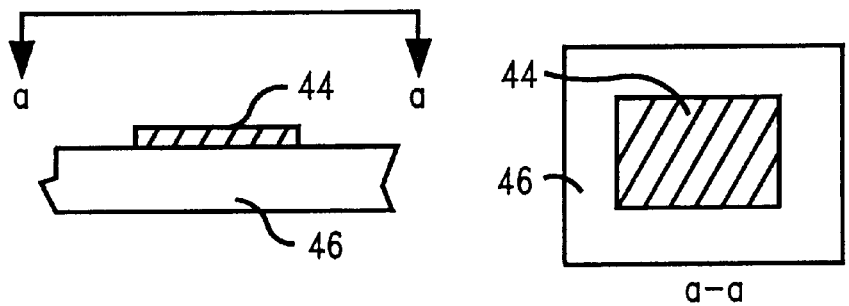
FIG. 9e is an elevational cross-sectional view of a high thermal conductivity greensheet having a low thermal conductivity greensheet layered thereon.
Figure 9F:
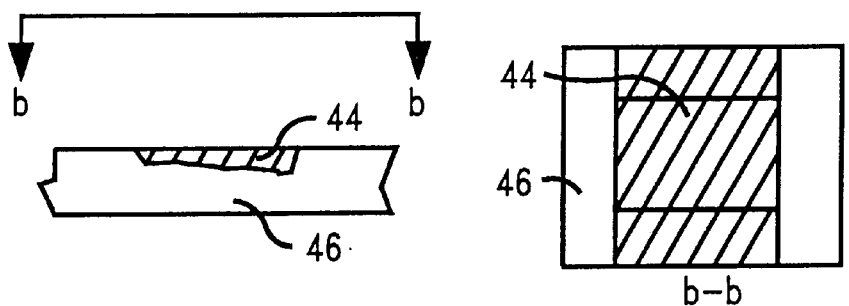
FIG. 9f is an elevational cross-sectional view of the structure of FIG. 9e prelaminated from the top.
Figure 9H:
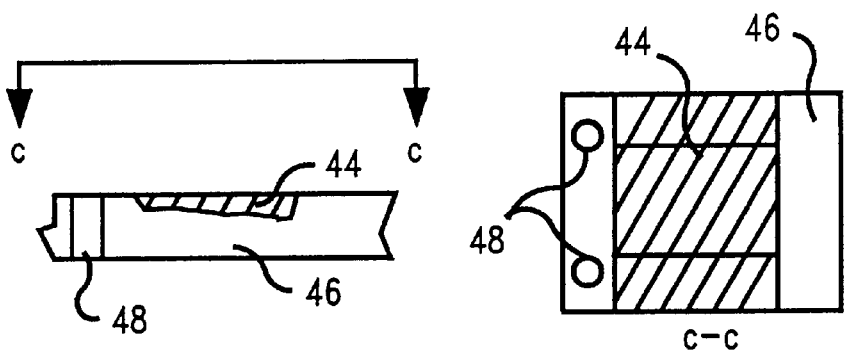
FIG. 9h is an elevational cross-sectional view of the structure of FIGS. 9e or 9f with vias punched therethrough.

The lower thermal conductivity greensheet 44 is then cut into a section of size which is smaller than the higher thermal conductivity greensheet 46, as shown in FIG. 9e. This section is either lightly prelaminated on top of greensheet 44, as shown in FIG. 9f, or lightly prelaminated next to a section of greensheet 44, as shown in FIG. 9g. Vias 48 are also punched into this layer so as to provide electrical connections between layers.

The second means for providing a zone of lower thermal conductivity is to introduce voids into a particular region of greensheet 46. In the preferred embodiment, this is done by means of punching a large number of vias 239, as shown in FIG. 9I. These vias are positioned such that they lie between the screened lines 5 and 6, and are not near the region where the interconnections between lines 5 and 6 take place. No reduction in thermal conductivity around the interconnections is desired. Other means of introducing voids include embossing and dimpling of the greensheets in the green state, such that voids remain in the sintered state.

When a low thermal conductivity region is used, the operations of screening pastes, introducing vias, and stacking take place as previously described.

Figure 10:
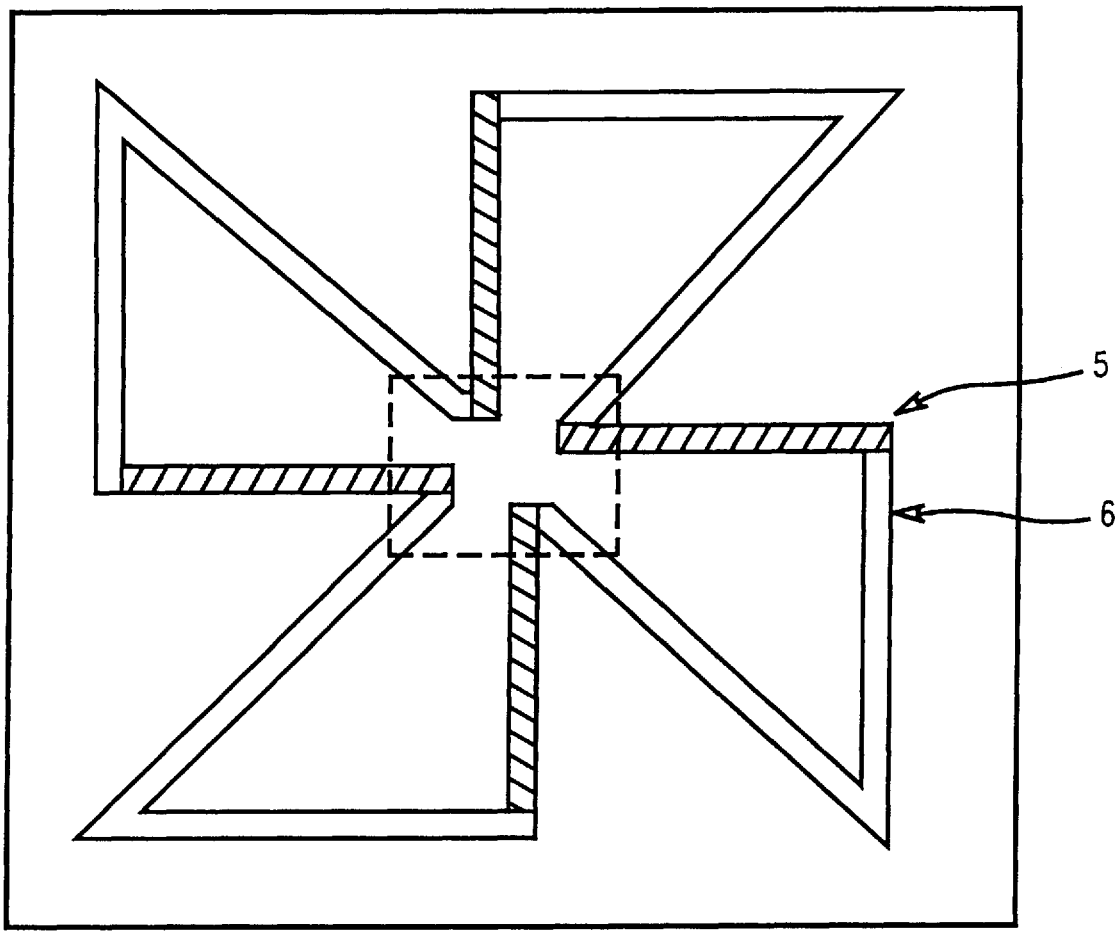
FIG. 10 is a top view of a radial fanout design of alternating semiconducting materials.

In a similar fashion, a radial fanout of alternating semiconductors or metals may be screened on the greensheet layers, which may then be stacked, laminated, and sintered. A simplified radial fanout design is illustrated in FIG. 10. In practice, such a device may have many more interconnections than as shown in the figure.

Thermoelectric Material-Backfilled Vias

A refractory metal, such as W or Mo, may be cosintered with a ceramic slab. The metal lines are thereby left porous or open. This porosity may be achieved in one of two preferred ways. The vias can be filled with paste containing tungsten of a large particle size such that achievement of a high percentage of theoretical density is unattainable, or an activated sintering aid, such as Fe or Ni, may be added to the paste to cause early densification of the metal, leaving behind an open structure. Similarly, the vias could be filled with a paste which contains a fugitive ingredient such as carbon.

The open porosity of the vias may be further increased by etching with an acid to remove the metal. An appropriate semiconducting material is then introduced into the porous or empty structure by heating to a temperature at which densification occurs. Two different agents are then backfilled to achieve the desired alternating n- and p-type semiconductors.

Wire or Rod Configurations

Figure 11A:
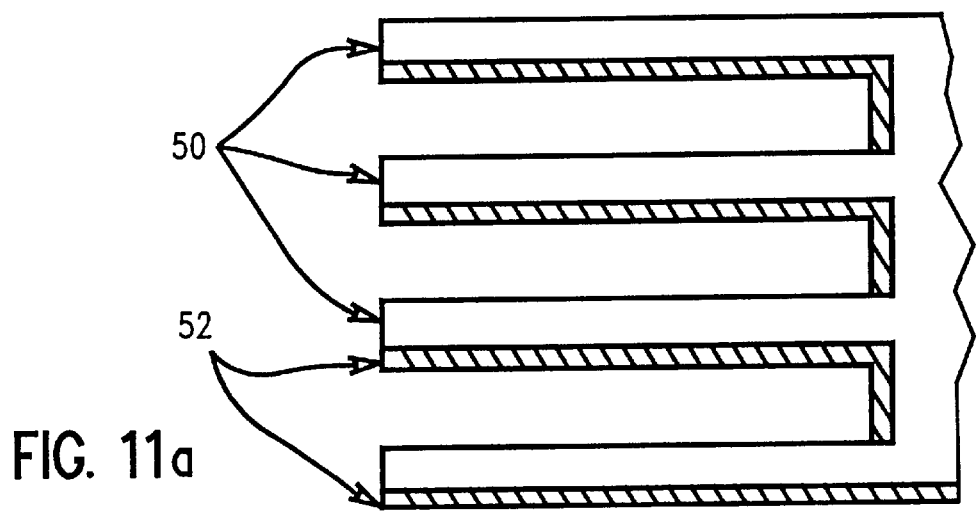
FIG. 11a is a top view of alternating n- and p-type wires situated in a linear fashion.
Figure 11B:
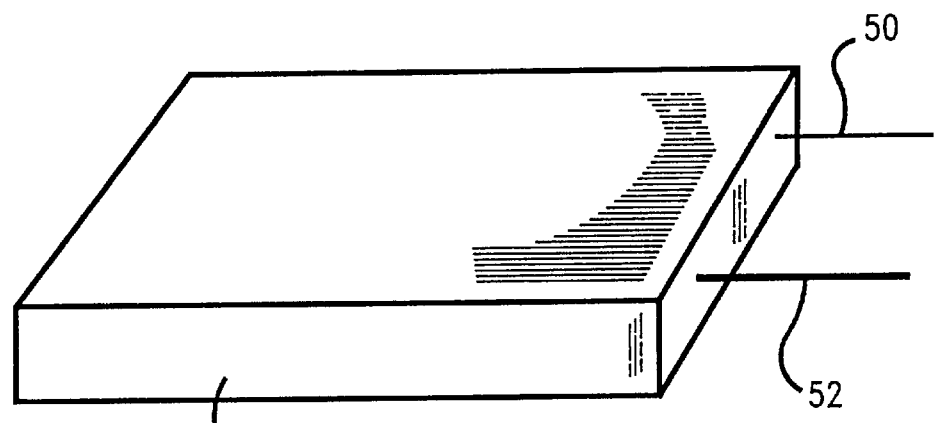
FIG. 11b is the wire configuration of FIG. 11a laminated in a greensheet block.
Figure 11C:
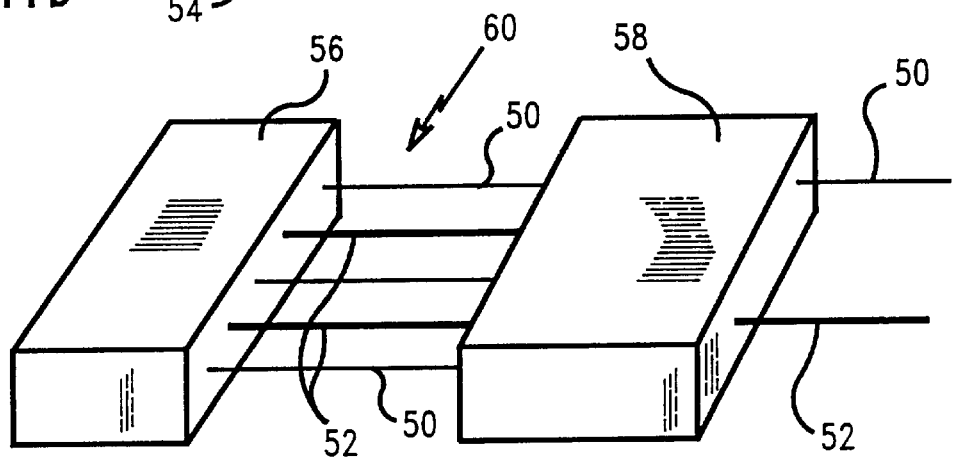
FIG. 11c is the wire configuration of FIG. 11a laminated in two greensheet blocks with an air cavity therebetween.

Another method for generating a linear design pattern of alternating semiconducting material is to utilize wires fashioned from n-type 50 and p-type 52 cosinterable metals, and arranging them in the alternating pattern shown in FIG. 11a. This assembly is then laminated and sintered in one of two ways: 1) laminating the wires in one greensheet block 54, FIG. 11b; or 2) laminating the wires across two separate greensheet blocks 56, 58, FIG. 11c, such that bare wires are exposed between the blocks in the open section of air 60, which acts as a lower thermal conductivity layer. A radial fanout design similar to that of FIG. 10 may also be employed with this methodology.

Blanket Metal (or semiconductor) Configuration

FIG. 12 illustrates another method for fabricating alternating lines of semiconducting material, referred to as a "blanket metal configuration". In this configuration, a number of layers, as shown in FIG. 12a, comprising a greensheet containing low thermal conductivity material 62 laminated to a greensheet containing high thermal conductivity material 64, resulting in a sandwiched, alternating thermal conductivity structure 66, are used between n- and p-type materials. N-type paste 67 is first applied or "blanketed" over one such layer 66, FIG. 12b. Next, FIG. 12c depicts another layer 66 applied over the n-type paste, such that a portion 68 of the n-type material is exposed, with the resulting laminated structure 70 depicted in FIG. 12d. Layer to layer connections may be provided by vias or additional prelamination. P-type paste 71 is then blanketed over structure 70, as illustrated in FIG. 12e, and the complete process is repeated several times to form a stack that can then be laminated and sintered.

Thermoelectric Device with a Liquid Channel

Figure 13:
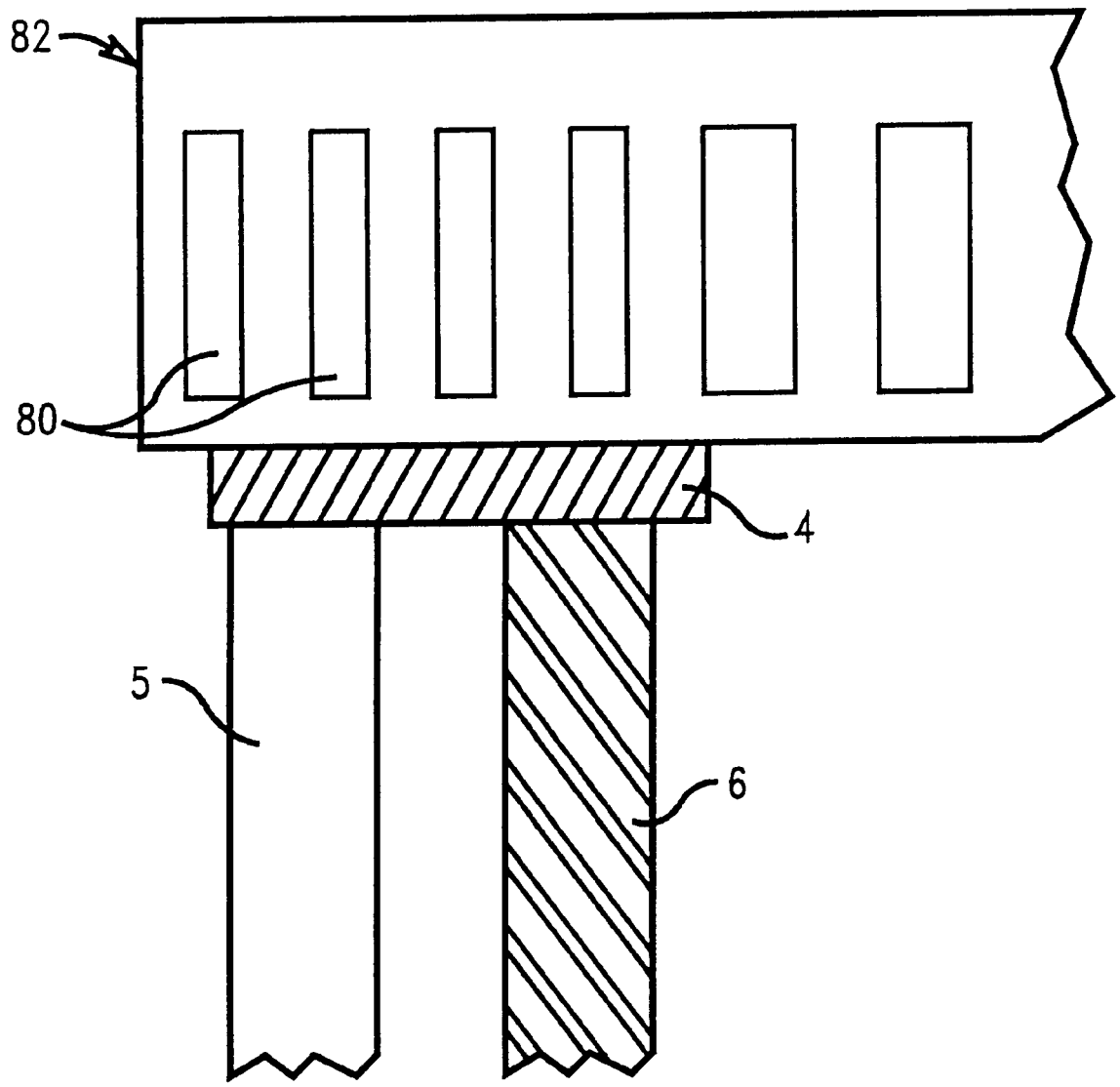
FIG. 13 is an elevational cross-sectional view of a portion of a thermoelectric device with channels for flow of heat transfer liquid situated within a high thermal conductivity ceramic block.

Another embodiment of an efficient thermoelectric device, taking advantage of current ceramic multilayer technology, is shown in FIG. 13, incorporating channels within the device for transferring thermal energy to a liquid material. Channels 80, for the purpose of liquid flow, are formed within a high thermal conductivity ceramic block 82, which also serves as a hot or cold substrate for the thermoelectric device. Although multilayer ceramic technology is preferred for fabrication of block 82, this block may also be machined. If an aluminum nitride ceramic is employed, a heat treatment in air may be applied to provide a protective oxide layer. Typically, in the prior art, a metal block 82 is attached to a ceramic plate with thermally conductive grease. The preferred embodiment of FIG. 13 is constructed without such a plate, directly attaching instead to alternating semiconducting materials 5, 6 through electrical connectors 4.

Figure 14:
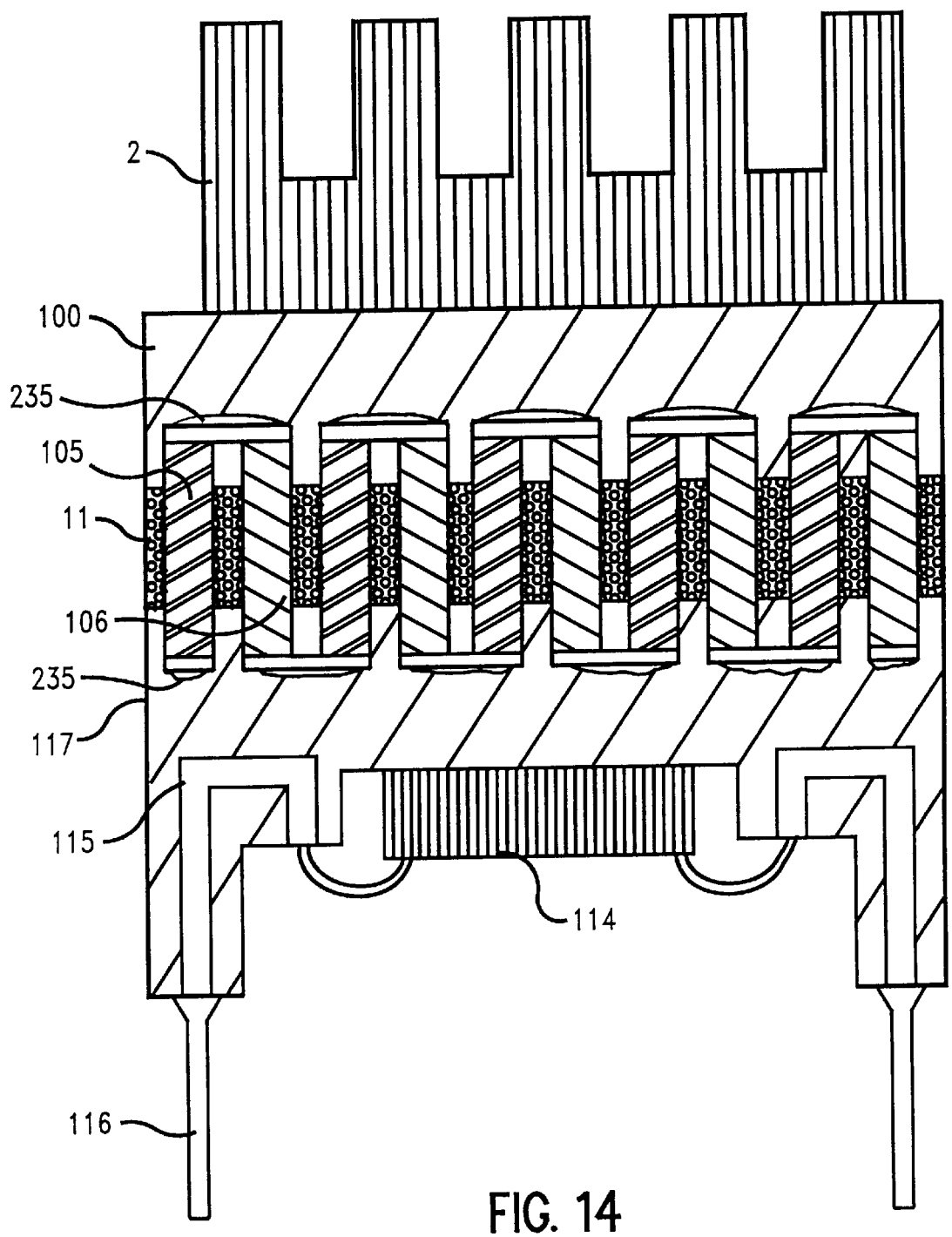
FIG. 14 is an elevational cross-sectional view of a thermoelectric device physically attached to an integrated circuit package.

Thermoelectric Devices Physically Incorporated within an Integrated Circuit Package FIG. 14 illustrates a thermoelectric device, which may employ any number of the aforementioned thermal design enhancements, physically attached to an integrated circuit. An integrated circuit chip 114 is attached to an electronic package 117 made of a high thermal conductivity ceramic and conductive wires 115, with appropriate input and output devices 116. The base plate 100 of the thermoelectric device is of the same material as the electronic package 117 and is physically incorporated within the package. The thermoelectric device is made of semiconducting elements 105, 106 which may be produced by the multilayer ceramic technology previously described.

Alternatively, the electronic package may be made of high thermal conductivity material and contain pads, vias, or junctions on one side for the purpose of forming a connection for the thermoelectric device. Importantly, in this configuration the device utilizes the package itself as a conduction plate.

In another embodiment, a thermoelectric device 119, shown in plan view in FIG. 15a, is fashioned from perpendicular lines in the plane of the ceramic package. The lines are arranged from semiconducting materials 105, 106 such that the center of the package 118 (where the chip resides) is cooled relative to the perimeter. The lines may be formed either from wires or multilayer ceramic technology using pastes made from powders of the appropriate materials which are co-fireable with the ceramic. In this embodiment, the semiconducting lines may be limited to a material set which is of a high melting point. FIG. 15b is a cross section of this embodiment.

In an alternative embodiment, FIG. 16a illustrates the semiconducting lines 105, 106 which are made of a material set that is post-fired on the surface of a sintered ceramic substrate. An encapsulation lid 120 is added to provide hermeticity to the thermoelectric device,. and to protect against condensation. This lid may be incorporated into a heat sink 121 as indicated. FIG. 16b is a cross-sectional view of this embodiment.

Figure 17:
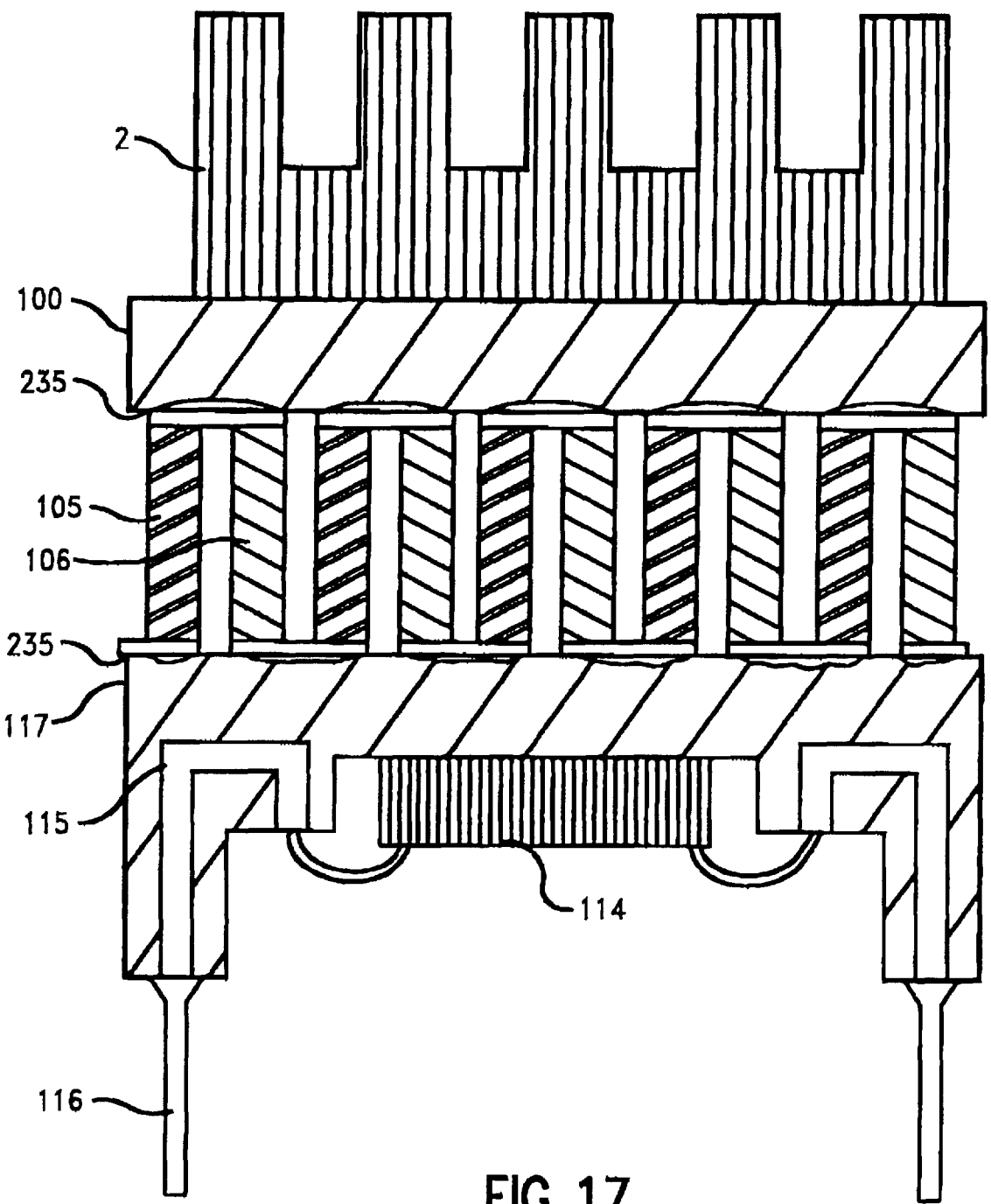
FIG. 17 is an elevational cross-sectional view of a thermoelectric device with a wire bonded chip and alternating semiconducting materials in a linear design.
Figure 18:
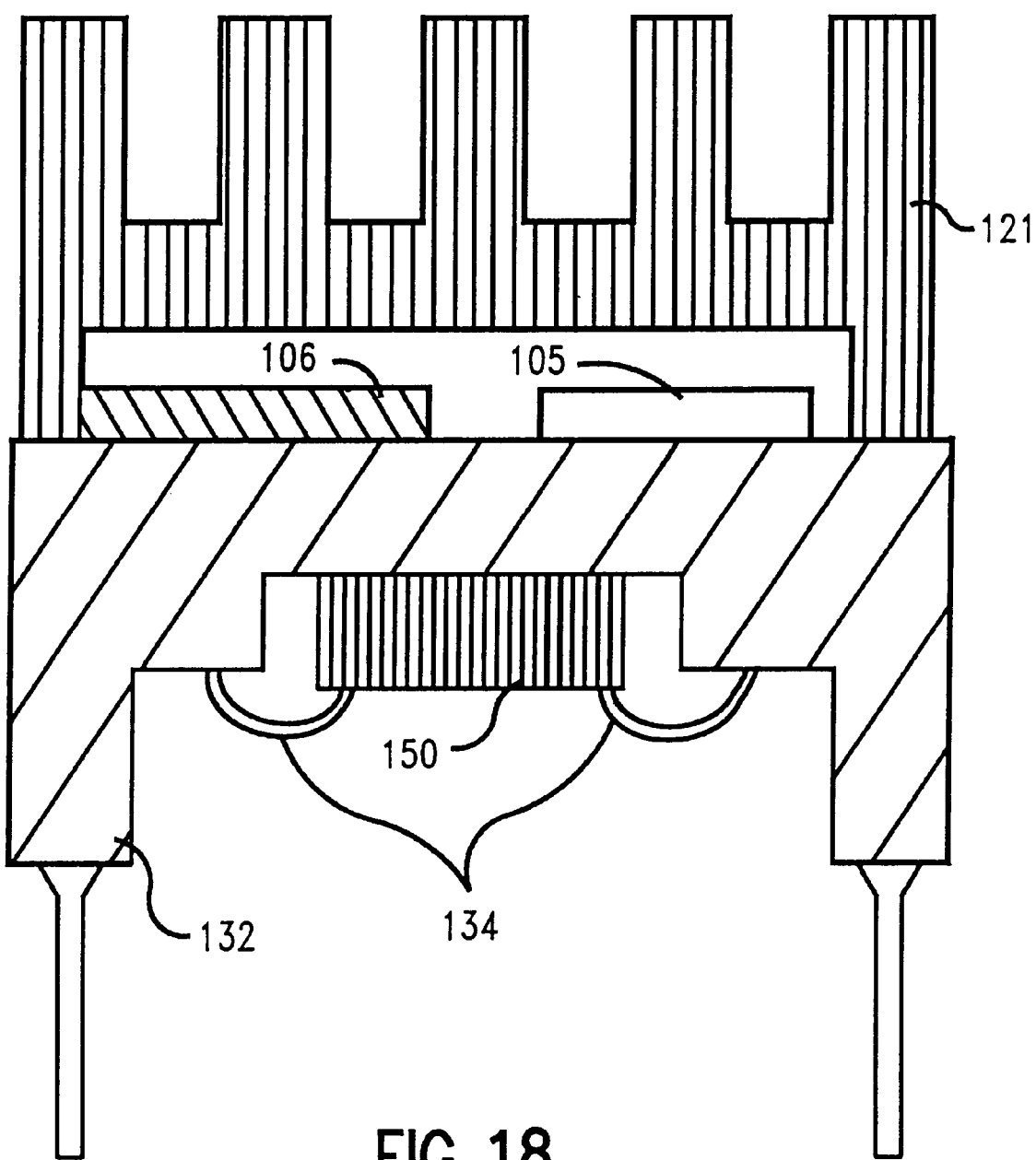
FIG. 18 is an elevational cross-sectional view of a thermoelectric device with a wire bonded chip and alternating semiconducting materials in a radial design.
Figure 19A:
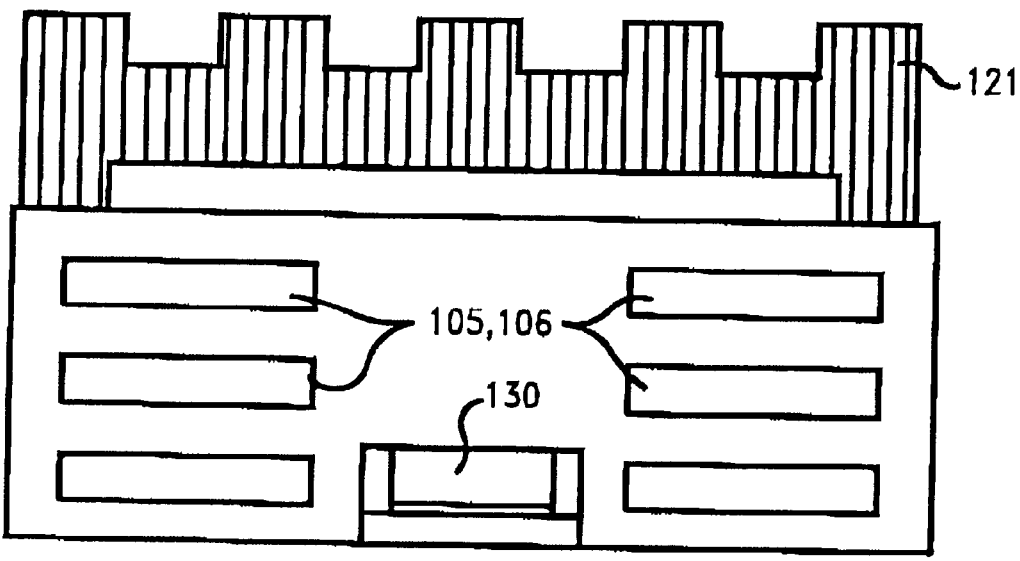
FIG. 19a is an elevational cross-sectional view of a thermoelectric device with a wire bonded CPU and alternating semiconducting materials in a stacked radial design.
Figure 19B:
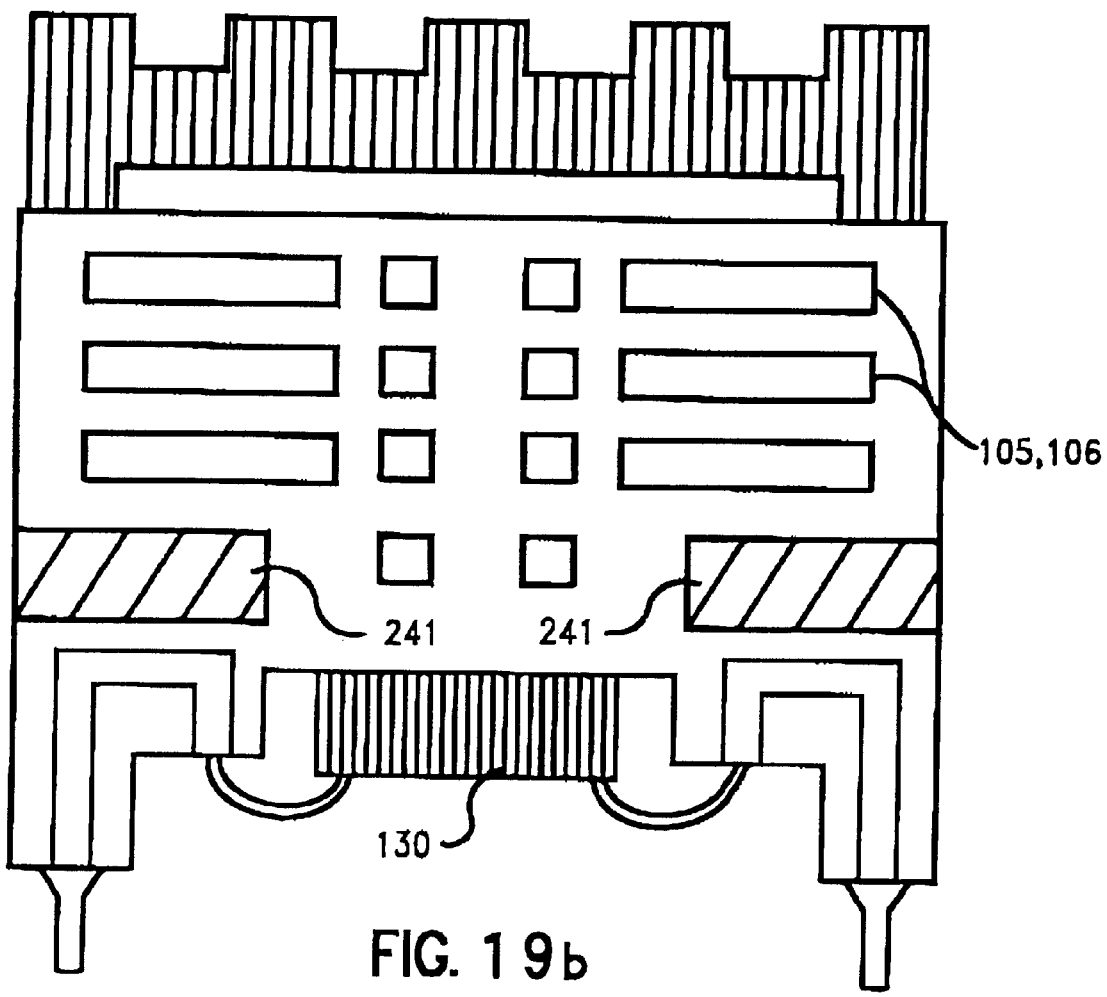
FIG. 19b is the structure of FIG. 19a with electrical connectors and a low thermal conductivity layer indicated.

FIGS. 17–22 illustrate cross-sectional views of other designs of thermoelectric devices incorporated within an integrated circuit package and capable of accommodating the aforementioned designs for thermal enhancements. FIGS. 17–19 depict a chip 114 or a CPU 130 electrically bonded to the integrated circuit package 132 through wire bonds 134.

FIG. 17 represents a line pattern for the alternating semiconducting materials. FIG. 18 is the radial design version of the semiconducting lines 105, 106 of FIG. 17. In the radial design, the thermoelectric device semiconducting components 105, 106 are preferably low melting point materials post-fired on the back surface of the wirebound package 132. FIGS. 19a,b depict the stacked radial version of the thermoelectric device of FIG. 18, cosintered into a wirebound package.

Figure 20:
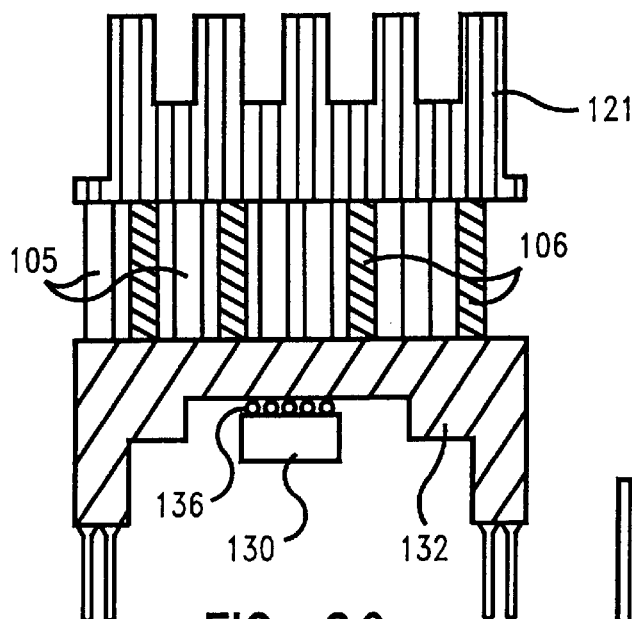
FIG. 20 is an elevational cross-sectional view of a thermoelectric device with a C4 mounted CPU and alternating semiconducting materials in a linear design.
Figure 21:
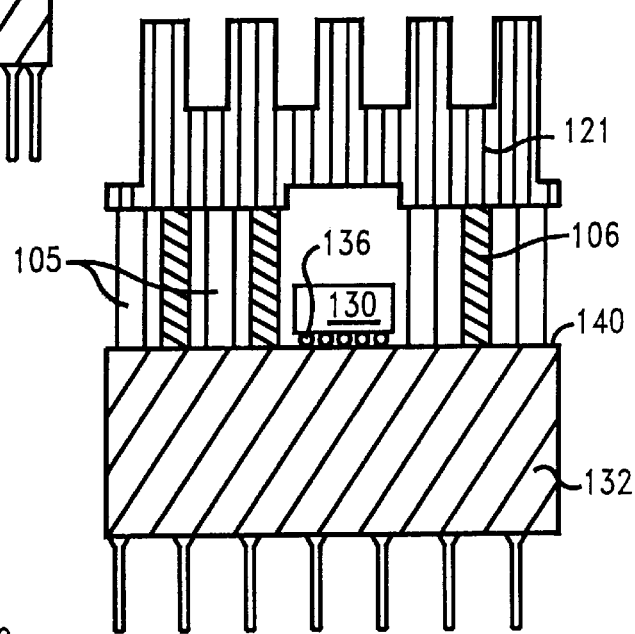
FIG. 21 is an elevational cross-sectional view of a thermoelectric device with a C4 mounted CPU surrounded by the alternating semiconducting materials in a linear design.
Figure 22:
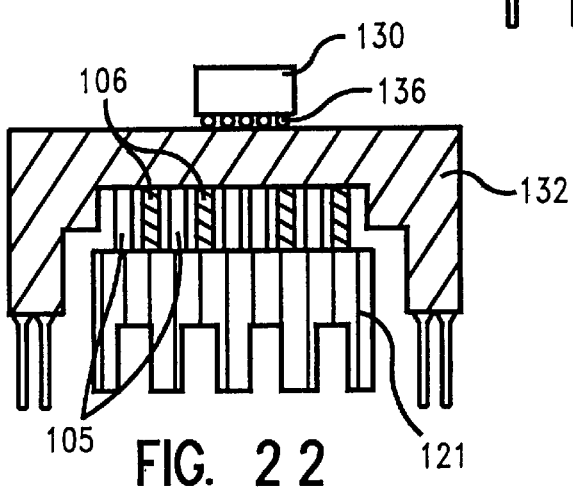
FIG. 22 is an elevational cross-sectional view of a thermoelectric device with a C4 mounted CPU on the opposite side of the electronic package, and having alternating semiconducting materials in a linear design on the opposite side.

FIGS. 20–22 illustrate cross-sectional views of the electronic package acting as one substrate of a thermoelectric device. CPU 130 is attached using C4 connectors 136. FIG. 20 shows a design similar to FIG. 17, with C4 connections 136 used in lieu of the wire bonds. FIG. 21 depicts a cross-sectional view of a circular array of thermoelectric elements on the top surface 140 of the IC package 132, surrounding CPU 130. Lastly, FIG. 22 illustrates a reversal of the design depicted in FIG. 20, wherein the CPU 130 with C4 connections 136 is on the opposite side of the electronic package 132, while the thermoelectric device components (semiconducting elements 105, 106, heat sink 121, and other elements of the thermoelectric device) are placed on the opposite side.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A thermoelectric device comprising:
   an environmentally protected multilayer ceramic substrate including:
   a plurality of blocks of two different materials arranged thermally in parallel, electrically in series;
   a lower plate of high thermal conductivity, having a top surface, a bottom surface, and a plurality of electrically conductive connectors inside said plates, forming electrical connections for said plurality of blocks on said top surface; and,
   an upper plate of high thermal conductivity, having a top surface, a bottom surface, and a plurality of electrically conductive connectors inside said plates, forming electrical connections for said plurality of blocks on said bottom surface.

2. The thermoelectric device of claim 1 further comprising a heat sink.

3. The thermoelectric device of claim 1 further including a low thermal conductivity material plate such that said high thermal conductivity plates have said low thermal conductivity material plate there between.

4. The thermoelectric device of claim 1 wherein said plurality of blocks comprise alternating blocks of n-type and p-type semi-conducting materials.

5. The thermoelectric device of claim 1 wherein said plurality of blocks comprise two different metals.

6. The thermoelectric device of claim 1 wherein said plurality of blocks comprise metal alloys having different Seebeck coefficients.

7. The thermoelectric device of claim 1 wherein said high thermal conductivity plates are comprised of aluminum nitride material.

8. The thermoelectric device of claim 1 wherein said electrical connections comprise non-cosinterable materials.

9. The thermoelectric device of claim 1 wherein the thermal conductivity of said lower plate is enhanced by further including electrically isolated features formed in said bottom surface.

10. The thermoelectric device of claim 9 wherein the thermal conductivity of said upper plate is enhanced by further including electrically isolated features formed in said top surface.

11. The thermoelectric device of claim 10 wherein said isolated features are formed by punching vias in said plates such that voids are generated during sintering.

12. The thermoelectric device of claim 10 wherein said isolated features are formed by embossing vias in said plates such that voids are generated during sintering.

13. The thermoelectric device of claim 9 wherein said electrically isolated features consist of high thermal conductivity metal paste or metal paste yielding a low theoretical density during sintering.

14. The thermoelectric device of claim 13 wherein said metal paste yielding a low theoretical density during sintering is etched out and backfilled with a high thermal conductivity metal.

15. The thermoelectric device of claim 13 wherein said high thermal conductivity metal is selected from the group consisting of copper, gold, or silver.

16. A thermoelectric device comprising:
   a plurality of blocks of at least two different materials arranged thermally in parallel, electrically in series;
   a lower aluminum nitride plate of high thermal conductivity, having a top surface and a plurality of electrically conductive vias and lines, forming electrical connections for said plurality of blocks on said top surface; and,
   an upper aluminum nitride plate of high thermal conductivity, having a bottom surface and a plurality of electrically conductive vias and lines, forming electrical connections for said plurality of blocks on said bottom surface.

17. The thermoelectric device of claim 16 further comprising a heat sink.

18. The thermoelectric device of claim 16 further including a low thermal conductivity material plate placed between said high thermal conductivity plates.

19. The thermoelectric device of claim 16 wherein said plurality of blocks comprise alternating blocks of n-type and p-type semi-conducting materials.

20. A thermoelectric device comprising:
- a plurality of blocks of at least two different materials arranged thermally in parallel, electrically in series;
- a lower plate of high thermal conductivity, having a top surface and a plurality of electrically conductive vias and lines, forming electrical connections for said plurality of blocks on said top surface; and,
- an upper plate of high thermal conductivity, having a bottom surface and a plurality of electrically conductive vias and lines, forming electrical connections for said plurality of blocks on said bottom surface; and,
- a middle plate having a low thermal conductivity zone therein.

21. The thermoelectric device of claim 20 wherein said low thermal conductivity zone comprises a low thermal conductivity greensheet having different material compositions therein.

22. The thermoelectric device of claim 21 wherein said greensheet comprises different material compositions selected from the group consisting of: aluminum oxide ceramic; zirconia based ceramic; fugitive phase materials; carbon; high starting oxygen content aluminum nitride; large particle size aluminum nitride; aluminum nitride without sintering aids; and small hollow glass spheres.

23. A thermoelectric device comprising:
- a plurality of blocks of two different materials arranged thermally in parallel, electrically in series;
- a lower plate of high thermal conductivity, having a top surface, a bottom surface, and a plurality of electrically conductive connectors inside said plate, forming electrical connections for said plurality of blocks on said top surface;
- an upper plate of high thermal conductivity, having a top surface, a bottom surface, and a plurality of electrically conductive connectors inside said plate, forming electrical connections for said plurality of blocks on said bottom surface; and,
- a low thermal conductivity material plate such that said high thermal conductivity plates have said low thermal conductivity plate there between.

24. A thermoelectric device comprising:
- a plurality of blocks of two different materials arranged thermally in parallel, electrically in series;
- a lower plate of high thermal conductivity, having a top surface, a bottom surface, and a plurality of electrically conductive connectors inside said plate, forming electrical connections for said plurality of blocks on said top surface, said thermal conductivity of said lower plate is enhanced by further including electrically isolated features formed in said bottom surface; and,
- an upper plate of high thermal conductivity, having a top surface, a bottom surface, and a plurality of electrically conductive connectors inside said plate, forming electrical connections for said plurality of blocks on said bottom surface.

25. A thermoelectric device comprising:
- a plurality of blocks of two different materials arranged thermally in parallel, electrically in series;
- a lower plate of high thermal conductivity, having a top surface, a bottom surface, and a plurality of electrically conductive connectors inside said plate, forming electrical connections for said plurality of blocks on said top surface, said thermal conductivity of said lower plate is enhanced by further including electrically isolated features formed in said bottom surface; and,
- an upper plate of high thermal conductivity, having a top surface, a bottom surface, and a plurality of electrically conductive connectors inside said plate, forming electrical connections for said plurality of blocks on said bottom surface, said thermal conductivity of said upper plate is enhanced by further including electrically isolated features formed in said top surface.

26. A thermoelectric device comprising:
- a plurality of blocks of two different materials arranged thermally in parallel, electrically in series;
- a lower plate of high thermal conductivity, having a top surface, a bottom surface, and a plurality of electrically conductive connectors inside said plate, forming electrical connections for said plurality of blocks on said top surface, said thermal conductivity of said lower plate is enhanced by further including electrically isolated features formed in said bottom surface; and,
- an upper plate of high thermal conductivity, having a top surface, a bottom surface, and a plurality of electrically conductive connectors inside said plate, forming electrical connections for said plurality of blocks on said bottom surface, said thermal conductivity of said upper plate is enhanced by further including electrically isolated features formed in said top surface;

wherein said isolated features are formed by punching vias in said plates such that voids are generated during sintering.

27. A thermoelectric device comprising:
- a plurality of blocks of two different materials arranged thermally in parallel, electrically in series;
- a lower plate of high thermal conductivity, having a top surface, a bottom surface, and a plurality of electrically conductive connectors inside said plate, forming electrical connections for said plurality of blocks on said top surface, said thermal conductivity of said lower plate is enhanced by further including electrically isolated features formed in said bottom surface; and,
- an upper plate of high thermal conductivity, having a top surface, a bottom surface, and a plurality of electrically conductive connectors inside said plate, forming electrical connections for said plurality of blocks on said bottom surface, said thermal conductivity of said upper plate is enhanced by further including electrically isolated features formed in said top surface;

wherein said isolated features are formed by embossing vias in said plates such that voids are generated during sintering.

28. A thermoelectric device comprising:
- a plurality of blocks of two different materials arranged thermally in parallel, electrically in series;
- a lower plate of high thermal conductivity, having a top surface, a bottom surface, and a plurality of electrically conductive connectors inside said plate, forming electrical connections for said plurality of blocks on said top surface, said thermal conductivity of said lower plate is enhanced by further including electrically isolated features formed in said bottom surface; and,
- an upper plate of high thermal conductivity, having a top surface, a bottom surface, and a plurality of electrically conductive connectors inside said plate, forming electrical connections for said plurality of blocks on said bottom surface;

wherein said electrically isolated features consist of high thermal conductivity metal paste or metal paste yielding a low theoretical density during sintering.

29. A thermoelectric device comprising:

a plurality of blocks of two different materials arranged thermally in parallel, electrically in series;

a lower plate of high thermal conductivity, having a top surface, a bottom surface, and a plurality of electrically conductive connectors inside said plate, forming electrical connections for said plurality of blocks on said top surface, said thermal conductivity of said lower plate is enhanced by further including electrically isolated features formed in said bottom surface; and, an upper plate of high thermal conductivity, having a top surface, a bottom surface, and a plurality of electrically conductive connectors inside said plate, forming electrical connections for said plurality of blocks on said bottom surface;

wherein said electrically isolated features consist of high thermal conductivity metal paste, or metal paste yielding a low theoretical density during sintering that is etched out and backfilled with a high thermal conductivity metal.

30. A thermoelectric device comprising:

a plurality of blocks of two different materials arranged thermally in parallel, electrically in series;

a lower plate of high thermal conductivity, having a top surface, a bottom surface, and a plurality of electrically conductive connectors inside said plate, forming electrical connections for said plurality of blocks on said top surface, said thermal conductivity of said lower plate is enhanced by further including electrically isolated features formed in said bottom surface; and, an upper plate of high thermal conductivity, having a top surface, a bottom surface, and a plurality of electrically conductive connectors inside said plate, forming electrical connections for said plurality of blocks on said bottom surface;

wherein said electrically isolated features consist of high thermal conductivity metal paste selected from the group consisting of copper, gold, or silver, or metal paste yielding a low theoretical density during sintering.

* * * * *

UNITED STATES PATENT AND TRADEMARK OFFICE
CERTIFICATE OF CORRECTION

PATENT NO.    : 6,121,539
DATED         : September 19, 2000
INVENTOR(S)   : Johnson et al.

Page 1 of 1

It is certified that error appears in the above-identified patent and that said Letters Patent is hereby corrected as shown below:

Column 3,
Lines 33-34, delete "Oct. 8, 1992" and substitute therefor -- Oct. 20, 1992 --.

Column 11,
Line 64, delete "GiaP" and substitute therefor -- GaP --.

Column 12,
After line 54, insert Sheet #1 of Drawings entitled "Table 1"

Signed and Sealed this

Third Day of September, 2002

Attest:

Attesting Officer

JAMES E. ROGAN
Director of the United States Patent and Trademark Office